(12) United States Patent
Wang et al.

(10) Patent No.: US 11,107,382 B2
(45) Date of Patent: Aug. 31, 2021

(54) SHIFT REGISTER AND METHOD FOR DRIVING THE SAME, GATE DRIVING CIRCUIT AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Ying Wang, Beijing (CN); Meng Li, Beijing (CN); Aifeng Gao, Beijing (CN); Hongmin Li, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/840,152

(22) Filed: Apr. 3, 2020

(65) Prior Publication Data
US 2021/0118347 A1  Apr. 22, 2021

(30) Foreign Application Priority Data

Oct. 18, 2019  (CN) .......................... 201910995347.7

(51) Int. Cl.
*G09G 3/20* (2006.01)
*G11C 19/28* (2006.01)
(52) U.S. Cl.
CPC ............... *G09G 3/20* (2013.01); *G11C 19/28* (2013.01); *G09G 2310/0286* (2013.01); *G09G 2330/028* (2013.01)

(58) Field of Classification Search
CPC .......................... G09G 2310/0286; G11C 19/28
See application file for complete search history.

(56) References Cited

U.S. PATENT DOCUMENTS

2010/0026669 A1   2/2010   Lee et al.
2018/0218698 A1   8/2018   Li et al.
(Continued)

FOREIGN PATENT DOCUMENTS

CN   106128409 A   11/2016
CN   107705762 A   2/2018
(Continued)

OTHER PUBLICATIONS

First Office Action for Chinese Application No. 201910995347.7, dated Apr. 2, 2021, 8 Pages.

*Primary Examiner* — Sanjiv D. Patel
(74) *Attorney, Agent, or Firm* — Brooks Kushman P.C.

(57) ABSTRACT

A shift register, a method for driving the same, a gate driving circuit and a display device are provided. The shift register includes an input sub-circuit, a pull-down control sub-circuit, an output sub-circuit and a reset sub-circuit. The pull-down control sub-circuit is connected to a first signal input terminal, a pull-up node, a pull-down node and a first power terminal, and is configured to supply a first voltage signal of the first power terminal to the pull-down node under the control of the first input signal and a potential of the pull-up node. The output sub-circuit is connected to the first node and a second clock signal terminal, and is configured to output a second clock signal of the second clock signal terminal to a first output terminal and a second output terminal under the control of the potential of the pull-up node.

19 Claims, 9 Drawing Sheets

(56) References Cited

U.S. PATENT DOCUMENTS

| | | | |
|---|---|---|---|
| 2019/0096350 A1 | 3/2019 | Zhao et al. | |
| 2019/0139475 A1* | 5/2019 | Wang | G09G 3/3674 |
| 2019/0206294 A1* | 7/2019 | Tian | G11C 19/28 |
| 2020/0027516 A1 | 1/2020 | Feng | |
| 2020/0168162 A1 | 5/2020 | Feng et al. | |
| 2020/0234623 A1 | 7/2020 | Li et al. | |

FOREIGN PATENT DOCUMENTS

| | | |
|---|---|---|
| CN | 108470535 A | 8/2018 |
| CN | 108877682 A | 11/2018 |
| CN | 109935185 A | 6/2019 |
| CN | 109935187 A | 6/2019 |
| CN | 110148383 A | 8/2019 |
| KR | 20100013931 A | 2/2010 |

\* cited by examiner

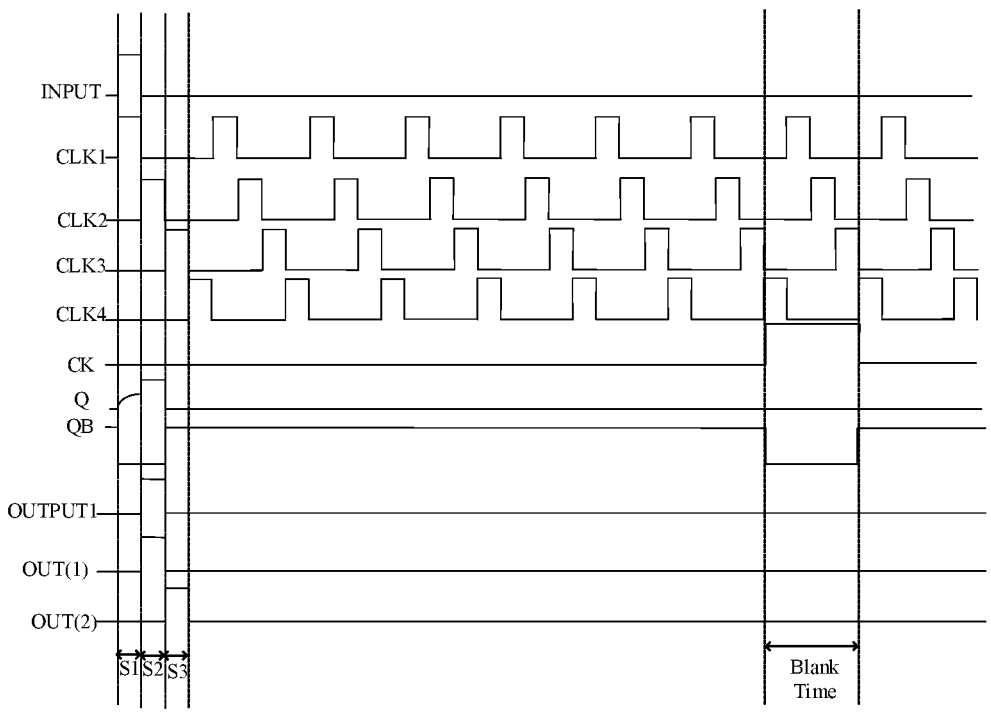

FIG. 13

| inputting, by the input sub-circuit, the first input signal of the first signal input terminal to the pull-up node under the control of a first clock signal terminal, and supplying, by the pull-down control sub-circuit, the first voltage signal of the first power terminal to the pull-down node under the control of the first input signal and the potential of the pull-up node | ~ 100 |

↓

| outputting, by the output sub-circuit, the second clock signal of the second clock signal terminal to the first output terminal and the second output terminal, and controlling the voltage of the pull-up node under the control of the potential of the first node | ~ 200 |

↓

| outputting, by the reset sub-circuit, the first voltage signal of the first power terminal to the pull-up node, the first output terminal and the second output terminal under the control of a third clock signal terminal and the potential of the pull-down node | ~ 300 |

FIG. 14

SHIFT REGISTER AND METHOD FOR DRIVING THE SAME, GATE DRIVING CIRCUIT AND DISPLAY DEVICE

CROSS-REFERENCE TO RELATED APPLICATION

This application claims priority to Chinese Patent Application No. 201910995347.7 filed on Oct. 18, 2019, which is incorporated herein by reference in its entirety.

TECHNICAL FIELD

The present disclosure relates to the field of display technology, in particular to a shift register and a method for driving the same, a gate driving circuit and a display device.

BACKGROUND

In recent years, flat panel displays, such as thin film transistor liquid crystal display (TFT-LCD) panels and active matrix organic light emitting diode (AMOLED) display panels, are widely applied in televisions (TVs), mobile phones and other electronic products, due to their advantages of being thin and light and having a low power consumption.

With the advancement of technology, high-resolution and narrow-frame display panels have become a development trend. Accordingly, Gate Driver on Array (GOA) technology has emerged. The GOA technology refers to that a GOA circuit for driving gate lines is disposed on both sides of an effective display area of an array substrate in a display panel, where the GOA circuit includes a plurality of shift registers.

SUMMARY

In a first aspect, a shift register is provided according to embodiments of the present disclosure. The shift register includes: an input sub-circuit, a pull-down control sub-circuit, an output sub-circuit and a reset sub-circuit, where:

the input sub-circuit is connected to a pull-up node and a first node, and is configured to input a first input signal of a first signal input terminal to the pull-up node under the control of a first clock signal;

the pull-down control sub-circuit is connected to the first signal input terminal, the pull-up node, a pull-down node and a first power terminal, and is configured to supply a first voltage signal of the first power terminal to the pull-down node under the control of the first input signal and a potential of the pull-up node;

the output sub-circuit is connected to the first node and a second clock signal terminal, and is configured to output a second clock signal of the second clock signal terminal to a first output terminal and a second output terminal under the control of the potential of the pull-up node, and control a voltage of the pull-up node under the control of a potential of the first node; and the reset sub-circuit is configured to reset potentials of the pull-up node, the first output terminal and the second output terminal under the control of a third clock signal and a potential of the pull-down node.

In some optional embodiments, the shift register further includes a noise reduction sub-circuit, where the noise reduction sub-circuit is connected to the pull-up node, the pull-down node, the first power terminal and a second power terminal, and is configured to maintain a voltage of the pull-down node under the control of the potential of the pull-up node.

In some optional embodiments, the noise reduction sub-circuit includes a first transistor, a second transistor and a third transistor;

a gate electrode of the first transistor is connected to the pull-up node, a first electrode of the first transistor is connected to a second node, and a second electrode of the first transistor is connected to a third node;

a gate electrode of the second transistor is connected to the pull-up node, a first electrode of the second transistor is connected to the third node, and a second electrode of the second transistor is connected to the first power terminal; and a gate electrode of the third transistor is connected to the pull-down node, a first electrode of the third transistor is connected to the third node, and a second electrode of the third transistor is connected to the second power terminal.

In some optional embodiments, the shift register further includes an output control sub-circuit, where the output control sub-circuit is configured to output the first voltage signal of the first power terminal to the second output terminal under the control of the third clock signal.

In some optional embodiments, the output control sub-circuit includes a fourth transistor and a fifth transistor; a gate electrode of the fourth transistor is connected to a third clock signal terminal, a first electrode of the fourth transistor is connected to the second output terminal, and a second electrode of the fourth transistor is connected to the first node; and a gate electrode of the fifth transistor is connected to the third clock signal terminal, a first electrode of the fifth transistor is connected to the first node, and a second electrode of the fifth transistor is connected to the first power terminal.

In some optional embodiments, the input sub-circuit includes a sixth transistor and a seventh transistor; a gate electrode of the sixth transistor is connected to a first clock signal terminal, a first electrode of the sixth transistor is connected to the first signal input terminal, and a second electrode of the sixth transistor is connected to the first node; and a gate electrode of the seventh transistor is connected to the first clock signal terminal, a first electrode of the seventh transistor is connected to the first node, and a second electrode of the seventh transistor is connected to the pull-up node.

In some optional embodiments, the pull-down control sub-circuit includes an eighth transistor, a ninth transistor, a tenth transistor and an eleventh transistor;

a gate electrode of the eighth transistor is connected to a second node, a first electrode of the eighth transistor is connected to a second power terminal, and a second electrode of the eighth transistor is connected to the pull-down node;

a gate and a first electrode of the ninth transistor are connected to the second power terminal, and a second electrode of the ninth transistor is connected to the second node;

a gate electrode of the tenth transistor is connected to the pull-up node, a first electrode of the tenth transistor is connected to the pull-down node, and a second electrode of the tenth transistor is connected to the first power terminal; and a gate electrode of the eleventh transistor is connected to the first signal input terminal, a first electrode of the eleventh transistor is connected to the pull-down node, and a second electrode of the eleventh transistor is connected to the first power terminal.

In some optional embodiments, the output sub-circuit includes a twelfth transistor, a thirteenth transistor, a fourteenth transistor and a capacitor;

a gate electrode of the twelfth transistor is connected to the pull-up node, a first electrode of the twelfth transistor is connected to the first node, and a second electrode of the twelfth transistor is connected to a second power terminal;

a gate electrode of the thirteenth transistor is connected to the pull-up node, a first electrode of the thirteenth transistor is connected to the second clock signal terminal, and a second electrode of the thirteenth transistor is connected to the first output terminal;

a gate electrode of the fourteenth transistor is connected to the pull-up node, a first electrode of the fourteenth transistor is connected to the second clock signal terminal, and a second electrode of the fourteenth transistor is connected to the second output terminal; and one end of the capacitor is connected to the pull-up node, and the other end of the capacitor is connected to the first output terminal.

In some optional embodiments, the reset sub-circuit includes a fifteenth transistor, a sixteenth transistor, a seventeenth transistor, an eighteenth transistor, a nineteenth transistor and a twentieth transistor;

a gate electrode of the fifteenth transistor is connected to a third clock signal terminal, a first electrode of the fifteenth transistor is connected to the pull-up node, and a second electrode of the fifteenth transistor is connected to the first node;

a gate electrode of the sixteenth transistor is connected to the third clock signal terminal, a first electrode of the sixteenth transistor is connected to the first node, and a second electrode of the sixteenth transistor is connected to the first power terminal;

a gate electrode of the seventeenth transistor is connected to the pull-down node, a first electrode of the seventeenth transistor is connected to the pull-up node, and a second electrode of the seventeenth transistor is connected to the first node;

a gate electrode of the eighteenth transistor is connected to the pull-down node, a first electrode of the eighteenth transistor is connected to the first node, and a second electrode of the eighteenth transistor is connected to the first power terminal;

a gate electrode of the nineteenth transistor is connected to the pull-down node, a first electrode of the nineteenth transistor is connected to the first output terminal, and a second electrode of the nineteenth transistor is connected to the first power terminal; and a gate electrode of the twentieth transistor is connected to the pull-down node, a first electrode of the twentieth transistor is connected to the second output terminal, and a second electrode of the twentieth transistor is connected to the first power terminal.

In some optional embodiments, the pull-down control sub-circuit is further configured to reset the potential of the pull-down node under the control of a second input signal.

In some optional embodiments, the pull-down control sub-circuit includes an eighth transistor, a ninth transistor, a tenth transistor, an eleventh transistor and a twenty-first transistor;

a gate electrode of the eighth transistor is connected to a second node, a first electrode of the eighth transistor is connected to a second power terminal, and a second electrode of the eighth transistor is connected to the pull-down node;

a gate electrode and a first electrode of the ninth transistor are connected to the second power terminal, and a second electrode of the ninth transistor is connected to the second node;

a gate electrode of the tenth transistor is connected to the pull-up node, a first electrode of the tenth transistor is connected to the pull-down node, and a second electrode of the tenth transistor is connected to the first power terminal;

a gate electrode of the eleventh transistor is connected to the first signal input terminal, a first electrode of the eleventh transistor is connected to the pull-down node, and a second electrode of the eleventh transistor is connected to the first power terminal; and a gate electrode of the twenty-first transistor is connected to a second signal input terminal, a first electrode of the twenty-first transistor is connected to the pull-down node, and a second electrode of the twenty-first transistor is connected to the first power terminal.

In some optional embodiments, all transistors in the shift register are N-type thin film transistors; or all transistors in the shift register are P-type thin film transistors.

In a second aspect, a gate driving circuit is further provided according to embodiments of the present disclosure, including a plurality of cascaded shift registers as described above, where:

a first signal input terminal of a first stage of the shift registers is connected to an initial signal input terminal, and a first signal input terminal of an (N+2)-th stage of the shift registers is connected to a first signal output terminal of an (N+1)-th stage of the shift registers, N being an integer greater than or equal to 0;

a second signal input terminal of each stage of the shift registers is connected to an external second input terminal;

an (4N+1)-th stage of the shift registers has a first clock signal terminal connected to an external first clock signal line, a second clock signal terminal connected to an external second clock signal line, and a third clock signal terminal connected to an external third clock signal line;

an (4N+2)-th stage of the shift registers has a first clock signal terminal connected to the external second clock signal line, a second clock signal terminal connected to the external third clock signal line, and a third clock signal terminal connected to an external fourth clock signal line;

an (4N+3)-th stage of the shift registers has a first clock signal terminal connected to the external third clock signal line, a second clock signal terminal connected to the external fourth clock signal line, and a third clock signal terminal connected to the external first clock signal line; and an (4N+4)-th stage of the shift registers has a first clock signal terminal connected to the external fourth clock signal line, a second clock signal terminal connected to the external first clock signal line, and a third clock signal terminal connected to the external second clock signal line.

In a third aspect, a method for driving the above shift register is further provided according to embodiments of the present disclosure, which includes:

inputting, by the input sub-circuit, the first input signal to the pull-up node under the control of a first clock signal terminal, and supplying, by the pull-down control sub-circuit, the first voltage signal of the first power terminal to the pull-down node under the control of the first input signal and the potential of the pull-up node;

outputting, by the output sub-circuit, the second clock signal of the second clock signal terminal to the first output terminal and the second output terminal, and controlling the voltage of the pull-up node under the control of the potential of the first node; and outputting, by the reset sub-circuit, the first voltage signal of the first power terminal to the pull-up node, the first output terminal and the second output terminal under the control of a third clock signal terminal and the potential of the pull-down node.

In some optional embodiments, the method further includes:

in a first stage, inputting a first-level signal to the first clock signal terminal and the first signal input terminal, so that the input sub-circuit inputs a first level to the pull-up node under the control of the first clock signal terminal;

in a second stage, inputting a first-level signal to the second clock signal terminal, to maintain the voltage of the pull-up node and to output the complete first level to the first output terminal and the second output terminal;

in a third stage, inputting a first-level signal to the third clock signal terminal of the reset sub-circuit, to reset the potentials of the pull-up node, the first output terminal and the second output terminal under the control of the first-level signal of the third clock signal terminal and the potential of the pull-down node; and in a fourth stage, inputting a first-level signal to the second signal input terminal of the pull-down control sub-circuit, to supply the first voltage signal of the first power terminal to the pull-down node under the control of the first level.

In a fourth aspect, a display device is further provided according to embodiments of the present disclosure, which includes the gate driving circuit as described in the second aspect.

Other features and advantages of the present disclosure will be explained in the following description, part of which becomes apparent from the description, or may be obtained by implementing the present disclosure. Other advantages of the present disclosure can be realized and obtained by schemes described in the description, claims and drawings.

BRIEF DESCRIPTION OF THE DRAWINGS

The drawings are used to illustrate technical solutions of the present disclosure, and constitute a part of the present disclosure. The technical solutions of the present disclosure are explained by the drawings together with embodiments of the present disclosure, which do not constitute a limitation to the technical solutions of the present disclosure.

FIG. 13 is a timing diagram of a shift register according to an embodiment of the present disclosure;

FIG. 14 is a flowchart of a method for driving a shift register according to an embodiment of the present disclosure;

DETAILED DESCRIPTION

In order to make objectives, technical solutions and advantages of the present disclosure clearer, embodiments of the present disclosure will be described in detail below with reference to the accompanying drawings. It should be noted that, in the case of no conflict, the embodiments in the present disclosure and the features in the embodiments can be arbitrarily combined with each other.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "including" and the like mean that an element or an article preceding the term contains elements or items and equivalents thereof behind the term, but does not exclude other elements or items.

It can be understood that, each of transistors provided in the embodiments of the present disclosure may be a thin film transistor, or a field effect transistor, or other devices having the same characteristics. Optionally, the thin film transistor provided in the embodiments of the present disclosure may be an oxide semiconductor transistor. Since a source electrode and a drain electrode of the thin film transistor provided herein are symmetrical, the source electrode and the drain electrode of the thin film transistor can be interchanged. In the embodiments of the present disclosure, in order to distinguish two electrodes of a transistor except the gate electrode, one of the source electrode and the drain electrode is referred to as a first electrode, and the other one of the source electrode and the drain electrode is referred to as a second electrode. That is, the first electrode may be a source electrode or a drain electrode, and the second electrode may be a drain electrode or a source electrode.

In related technologies, a voltage of a pull-up node of a shift register may be lost or leaked, which may result in an incomplete output signal of a display panel and may adversely affect display quality of the display panel.

In view of the above, a shift register and a method for driving the same, a gate driving circuit and a display device are provided according to embodiments of the present disclosure, so as to improve display quality of the display device.

Figure 1:
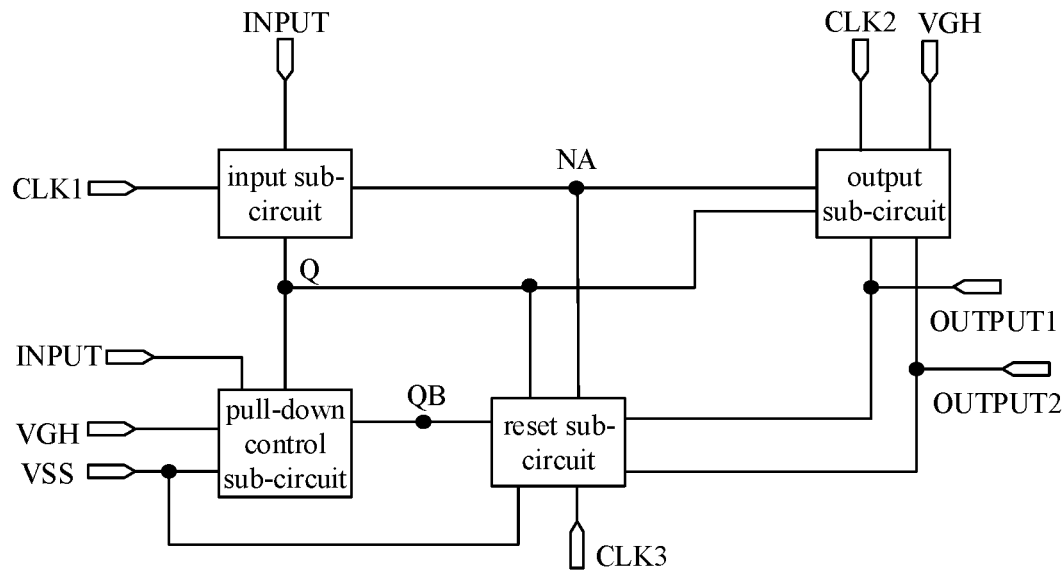
FIG. 1 is a first schematic structural diagram of an exemplary shift register according to an embodiment of the present disclosure.

An embodiment of the present disclosure provides a shift register. FIG. 1 is a schematic structural diagram of a shift register provided by an embodiment of the present disclosure. As shown in FIG. 1, the shift register provided by the embodiment of the present disclosure includes: an input sub-circuit, a pull-down control sub-circuit, an output sub-circuit and a reset sub-circuit.

The input sub-circuit is connected to a pull-up node Q and a first node NA, and is configured to input a first input signal of a first signal input terminal INPUT to the pull-up node Q under the control of a first clock signal at a first clock signal terminal CLK1.

The pull-down control sub-circuit is connected to the first signal input terminal INPUT, the pull-up node Q, a pull-down node QB and a first power terminal VSS, and is configured to supply a first voltage signal of the first power terminal VSS to the pull-down node QB under the control of the first input signal of the first signal input terminal INPUT and a potential of the pull-up node Q.

The output sub-circuit is connected to a second clock signal terminal CLK2, and is configured to output a second clock signal at the second clock signal terminal CLK2 to a first output terminal OUTPUT1 and a second output terminal OUTPUT2 under the control of the potential of the pull-up node Q, and maintain an a voltage of the pull-up node Q under the control of a potential of the first node NA.

The reset sub-circuit is configured to reset potentials of the pull-up node Q, the first output terminal OUTPUT1 and the second output terminal OUTPUT2 under the control of a third clock signal and a potential of the pull-down node QB.

Specifically, the input sub-circuit is connected to the first signal input terminal INPUT, the pull-up node Q, the first node NA and the first clock signal terminal CLK1, and is configured to input a signal of the first signal input terminal INPUT to the pull-up node Q under the control of the first clock signal terminal CLK1.

The pull-down control sub-circuit is connected to the first signal input terminal INPUT, the pull-up node Q, the pull-down node QB, the first power terminal VSS, and a second power terminal VGH, and is configured to supply a first voltage signal of the first power terminal VSS to the pull-down node QB under the control of the signal of the first signal input terminal INPUT and the potential of the pull-up node Q.

The output sub-circuit is connected to the pull-up node Q, the first node NA, the second clock signal terminal CLK2, the second power terminal VGH, the first output terminal OUTPUT1 and the second output terminal OUTPUT2, and is configured to output the second clock signal at the second clock signal terminal CLK2 to a first output terminal OUTPUT1 and a second output terminal OUTPUT2 under the control of the potential of the pull-up node Q, and maintain the voltage of the pull-up node Q under action of the potential of the first node NA.

The reset sub-circuit is connected to the pull-up node Q, the pull-down node QB, the first node NA, the first power terminal VSS, a third clock signal terminal CLK3, the first output terminal OUTPUT1 and the second output terminal OUTPUT2, and is configured to reset potentials of the pull-up node Q, the first output terminal OUTPUT1 and the second output terminal OUTPUT2 under the control of a third clock signal.

In the shift register according to the embodiment of the present disclosure, the output sub-circuit maintains the voltage of the pull-up node Q in response to the first node NA, which ensures that the voltage of the pull-up node does not leak and ensures the signal at the second clock signal terminal CLK2 to be completely outputted to the first output terminal and the second output terminal, thereby improving display quality of a display panel.

Figure 2:
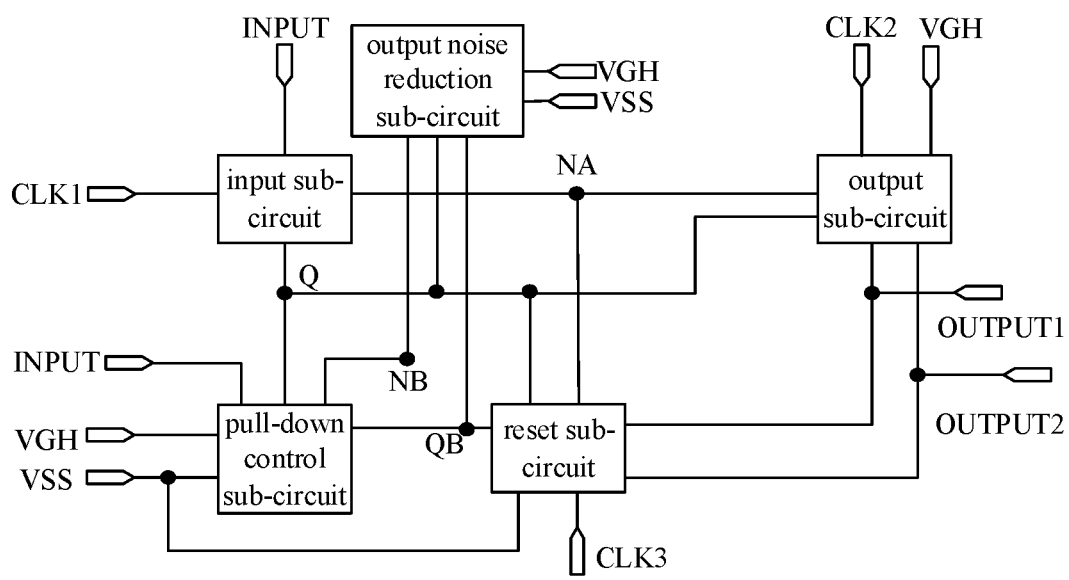
FIG. 2 is a second schematic structural diagram of an exemplary shift register according to an embodiment of the present disclosure.

Optionally, as shown in FIG. 2, the shift register further includes: a noise reduction sub-circuit configured to control a voltage of the pull-down node QB under the control of the pull-up node Q.

Specifically, the noise reduction sub-circuit is connected to the pull-up node Q, the pull-down node QB, a second node NB, the first power terminal VSS, and the second power terminal VGH, and is configured to maintain the voltage of the pull-down node QB at a high level under the control of the pull-up node Q.

Figure 3:
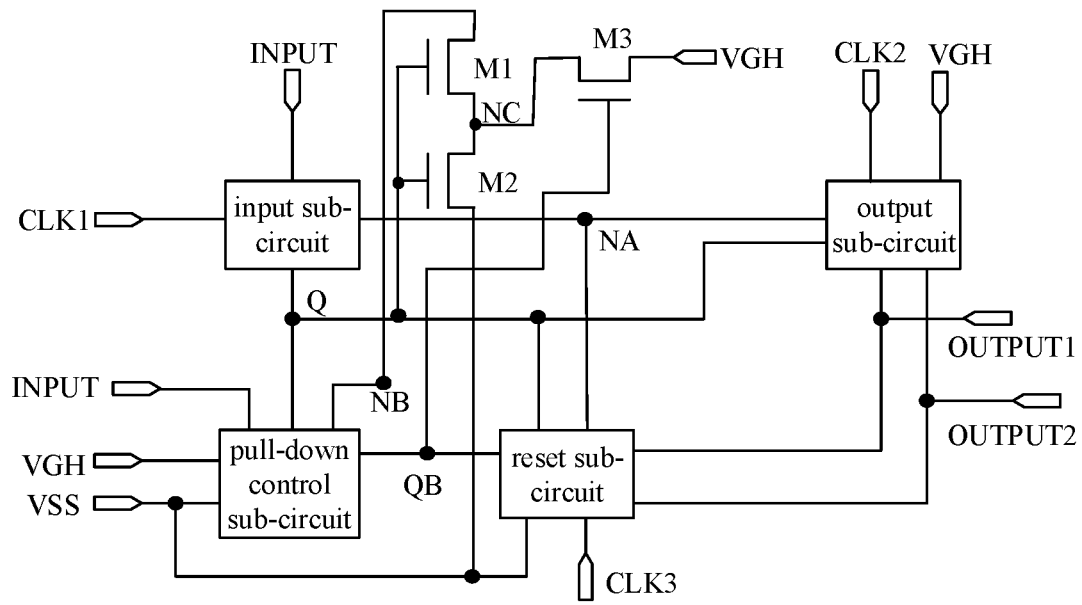
FIG. 3 is an equivalent circuit diagram of a noise reduction sub-circuit according to an embodiment of the present disclosure.

FIG. 3 is an equivalent circuit diagram of a noise reduction sub-circuit according to an optional embodiment of the present disclosure. As shown in FIG. 3, the noise reduction sub-circuit according to the embodiment of the present disclosure includes a first transistor M1, a second transistor M2 and a third transistor M3.

Specifically, a gate electrode of the first transistor M1 is connected to the pull-up node Q, a first electrode of the first transistor M1 is connected to the second node NB, and a second electrode of the first transistor M1 is connected to the third node NC. A gate electrode of the second transistor M2 is connected to the pull-up node Q, a first electrode of the second transistor M2 is connected to the third node NC, and a second electrode of the second transistor M2 is connected to the first power terminal VSS. A gate electrode of the third transistor M3 is connected to the pull-down node QB, a first electrode of the third transistor M3 is connected to the third node NC, and a second electrode of the third transistor M3 is connected to the second power terminal VGH.

An exemplary structure of the noise reduction sub-circuit is specifically shown in FIG. 3. Those skilled in the art can easily understand that an implementation of the noise reduction sub-circuit is not limited to this, as long as a function of the noise reduction sub-circuit can be realized.

At present, a material for manufacturing a thin film transistor (TFT) generally includes amorphous silicon (a-si), oxide, and low-temperature polysilicon (LTPS). The oxide is applicable to a panel of the medium size and the large size, due to advantages of the oxide process such as high mobility, good uniformity and high stability. However, characteristics of the oxide TFT are easily affected by water vapor, oxygen concentration and illumination, and abnormal display may occur when a threshold voltage Vth of the TFT is below 0 v if the gate driving circuit structure is formed through the conventional a-si process. In the embodiments of the present disclosure, the first electrode of the third transistor M3 is connected between the first transistor M1 and the second transistor M2, so as to ensure the pull-down node QB at a relatively high level when a transistor of the pull-down control sub-circuit (such as the eighth transistor M8 shown in FIG. 7) has a relatively low threshold voltage Vth (for example, Vth being equal to −4 v).

Figure 4:
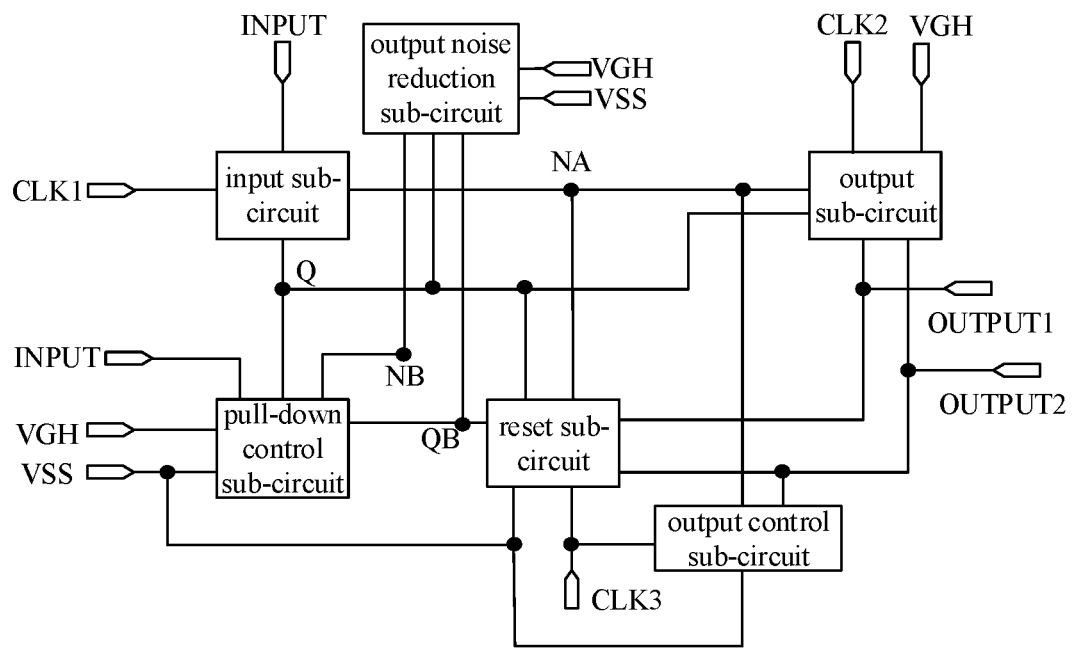
FIG. 4 is a third schematic structural diagram of an exemplary shift register according to an embodiment of the present disclosure.

Optionally, as shown in FIG. 4, the shift register further includes an output control sub-circuit configured to output the first voltage signal of the first power terminal to the second output terminal under the control of the third clock signal.

Specifically, the output control sub-circuit is connected to the second output terminal OUTPUT2, the first node NA, the third clock signal terminal CLK3 and the first power terminal VSS, and is configured to shorten the falling edge time of a signal outputted from the output terminal OUTPUT2 under the control of the third clock signal terminal CLK3.

Figure 5:
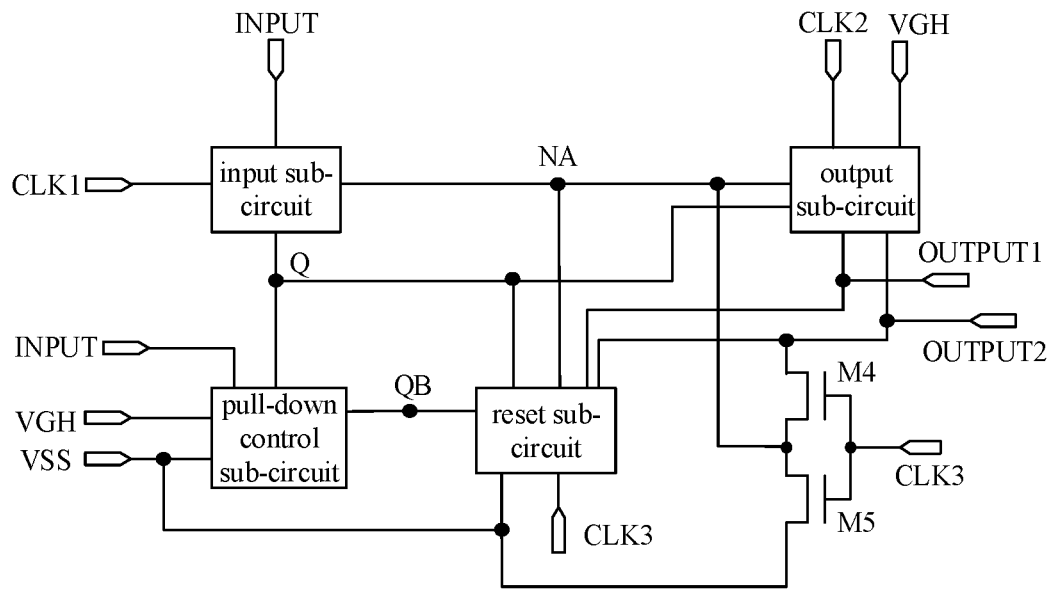
FIG. 5 is an equivalent circuit diagram of an output control sub-circuit according to an embodiment of the present disclosure.

FIG. 5 is an equivalent circuit diagram of an output control sub-circuit according to an optional embodiment of the present disclosure. As shown in FIG. 5, the output control sub-circuit according to the embodiment of the present disclosure includes a fourth transistor M4 and a fifth transistor M5.

Specifically, a gate electrode of the fourth transistor M4 is connected to the third clock signal terminal CLK3, a first electrode of the fourth transistor M4 is connected to the second output terminal OUTPUT2, and a second electrode of the fourth transistor M4 is connected to the first node NA. A gate electrode of the fifth transistor M5 is connected to the third clock signal terminal CLK3, a first electrode of the fifth transistor M5 is connected to the first node NA, and a second electrode of the fifth transistor M5 is connected to the first power terminal VSS.

An exemplary structure of the output control sub-circuit is specifically shown in FIG. 5. Those skilled in the art can easily understand that an implementation of the output control sub-circuit is not limited to this, as long as its corresponding function can be achieved.

In a gate driving circuit of a conventional large-size display panel, a falling edge of a scan signal outputted by the gate driving circuit lasts a relatively long time Tf, which adversely affects normal display. The shift register in the embodiments of the present disclosure is designed with the fourth transistor M4 and the fifth transistor M5 while ensuring a narrow frame. Under the control of an effective level of the third clock signal terminal CLK3, the fourth transistor M4 and the fifth transistor M5 are turned on, so that the signal outputted by the second output terminal OUTPUT2 is quickly pulled down to a low voltage by the first power terminal VSS, which can greatly reduce a duration Tf of the falling edge of the outputted signal, and make the falling edge of the outputted signal steeper.

Figure 6:
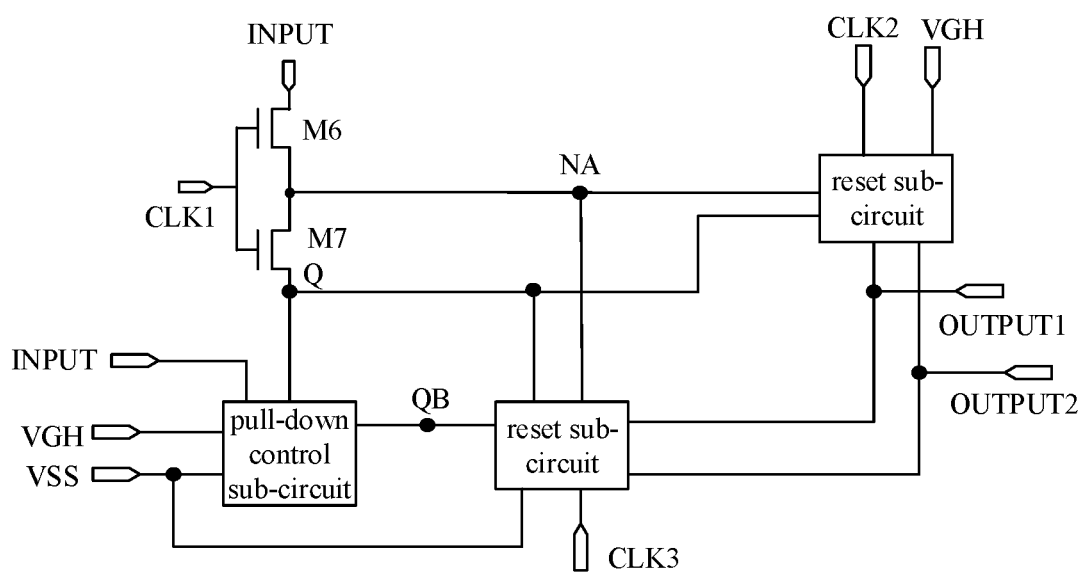
FIG. 6 is an equivalent circuit diagram of an input sub-circuit according to an embodiment of the present disclosure.

FIG. 6 is an equivalent circuit diagram of an input sub-circuit according to an optional embodiment of the present disclosure. As shown in FIG. 6, the input sub-circuit according to the embodiment of the present disclosure includes a sixth transistor M6 and a seventh transistor M7.

Specifically, a gate electrode of the sixth transistor M6 is connected to the first clock signal terminal CLK1, a first electrode of the sixth transistor M6 is connected to the first signal input terminal INPUT, and a second electrode of the sixth transistor M6 is connected to the first node NA. A gate electrode of the seventh transistor M7 is connected to the first clock signal terminal CLK1, a first electrode of the seventh transistor M7 is connected to the first node NA, and a second electrode of the seventh transistor M7 is connected to the pull-up node Q.

An exemplary structure of the input sub-circuit is specifically shown in FIG. 6. Those skilled in the art can easily understand that an implementation of the input sub-circuit is not limited thereto, as long as the corresponding function of the input sub-circuit can be realized.

Figure 7:
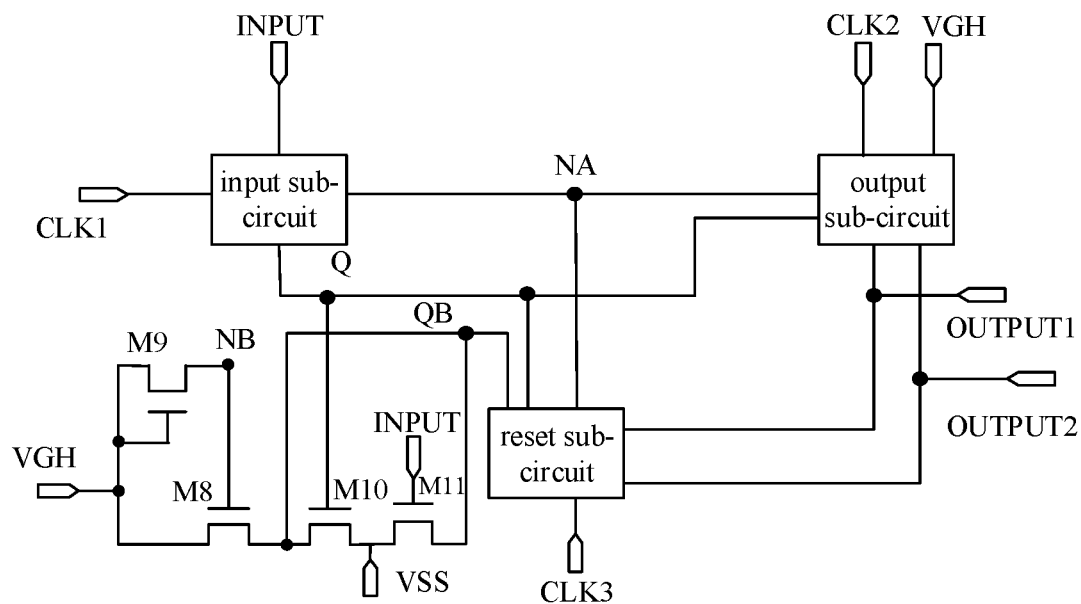
FIG. 7 is an equivalent circuit diagram of a pull-down control sub-circuit according to an embodiment of the present disclosure.

FIG. 7 is an equivalent circuit diagram of a pull-down control sub-circuit according to an optional embodiment of the present disclosure. As shown in FIG. 7, the pull-down control sub-circuit according to the embodiment of the present disclosure includes an eighth transistor M8, a ninth transistor M9, a tenth transistor M10 and eleventh transistor M11.

Specifically, a gate electrode of the eighth transistor M8 is connected to the second node NB, a first electrode of the eighth transistor M8 is connected to the second power terminal VGH, and a second electrode of the eighth transistor M8 is connected to the pull-down node QB. A gate and a first electrode of the ninth transistor M9 are respectively connected to the second power terminal VGH, and a second electrode of the ninth transistor M9 is connected to the second node NB. A gate electrode of the tenth transistor M10 is connected to the pull-up node Q, a first electrode of the tenth transistor M10 is connected to the pull-down node QB, and a second electrode of the tenth transistor M10 is connected to the first power terminal VSS. A gate electrode of the eleventh transistor M11 is connected to the first signal input terminal INPUT, a first electrode of the eleventh transistor M11 is connected to the pull-down node QB, and a second electrode of the eleventh transistor M11 is connected to the first power terminal VSS.

An exemplary structure of the pull-down control sub-circuit is specifically shown in FIG. 7. Those skilled in the art can easily understand that an implementation of the pull-down control sub-circuit is not limited to this, as long as the corresponding function of the pull-down control sub-circuit can be realized.

Figure 8:
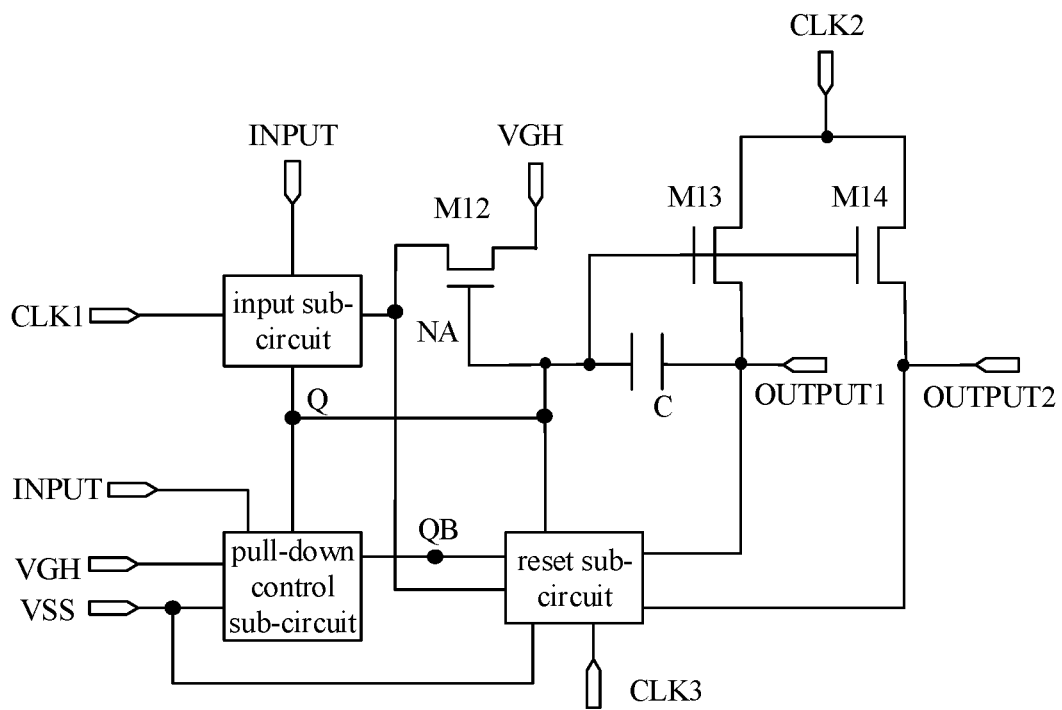
FIG. 8 is an equivalent circuit diagram of an output sub-circuit according to an embodiment of the present disclosure.

FIG. 8 is an equivalent circuit diagram of an output sub-circuit according to an optional embodiment of the present disclosure. As shown in FIG. 8, the output sub-circuit according to the embodiment of the present disclosure includes a twelfth transistor M12, a thirteenth transistor M13, a fourteenth transistor M14 and a capacitor C.

Specifically, a gate electrode of the twelfth transistor M12 is connected to the pull-up node Q, a first electrode of the twelfth transistor M12 is connected to the first node NA, and a second electrode of the twelfth transistor M12 is connected to the second power terminal VGH. A gate electrode of the thirteenth transistor M13 is connected to the pull-up node Q, a first electrode of the thirteenth transistor M13 is connected to the second clock signal terminal CLK2, and a second electrode of the thirteenth transistor M13 is connected to the first output terminal OUTPUT1. A gate electrode of the fourteenth transistor M14 is connected to the pull-up node Q, a first electrode of the fourteenth transistor M14 is connected to the second clock signal terminal CLK2, and a second electrode of the fourteenth transistor M14 is connected to the second output terminal OUTPUT2. One end of the capacitor C is connected to the pull-up node Q, and the other end of the capacitor C is connected to the first output terminal OUTPUT1.

An exemplary structure of the output sub-circuit is specifically shown in FIG. 8. Those skilled in the art can easily understand that an implementation of the output sub-circuit is not limited to this, as long as the corresponding function of the output sub-circuit can be realized.

Figure 9:
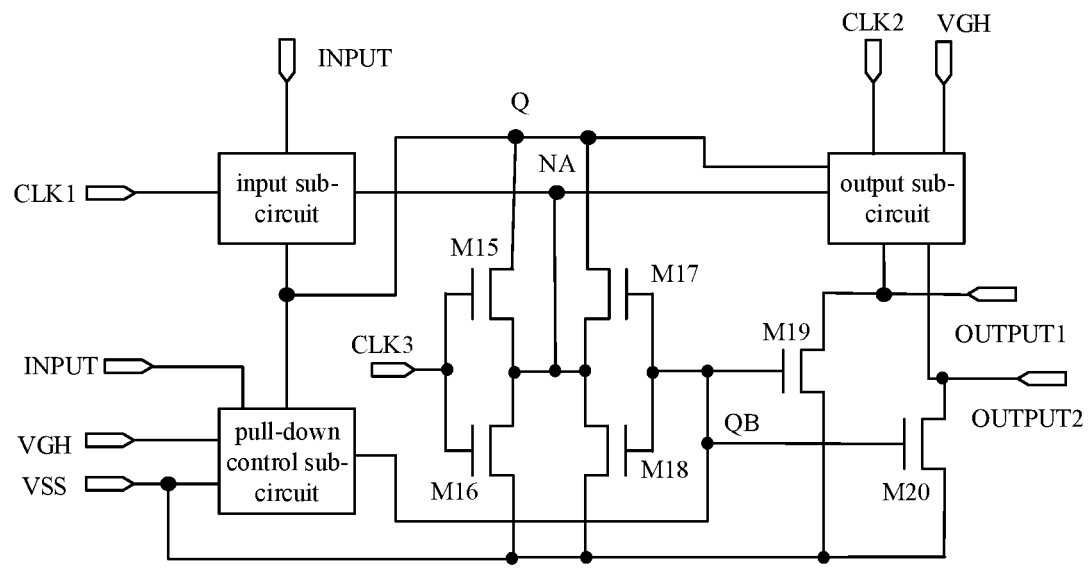
FIG. 9 is an equivalent circuit diagram of a reset sub-circuit according to an embodiment of the present disclosure.

FIG. 9 is an equivalent circuit diagram of a reset sub-circuit according to an optional embodiment of the present disclosure. As shown in FIG. 9, the reset sub-circuit according to the embodiment of the present disclosure includes a fifteenth transistor M15, a sixteenth transistor M16, a seventeenth transistor M17, an eighteenth transistor M18, a nineteenth transistor M19, and a twentieth transistor M20.

Specifically, a gate electrode of the fifteenth transistor M15 is connected to the third clock signal terminal CLK3, a first electrode of the fifteenth transistor M15 is connected to the pull-up node Q, and a second electrode of the fifteenth transistor M15 is connected to the first node NA. A gate electrode of the sixteenth transistor M16 is connected to the third clock signal terminal CLK3, a first electrode of the sixteenth transistor M16 is connected to the first node NA, and a second electrode of the sixteenth transistor M16 is connected to the first power terminal VSS. A gate electrode of the seventeenth transistor M17 is connected to the pull-down node QB, a first electrode of the seventeenth transistor M17 is connected to the pull-up node Q, and a second electrode of the seventeenth transistor M17 is connected to the first node NA. A gate electrode of the eighth transistor M18 is connected to the pull-down node QB, a first electrode of the eighteenth transistor M18 is connected to the first node NA, and a second electrode of the eighteenth transistor M18 is connected to the first power terminal VSS. A gate electrode of the nineteenth transistor M19 is connected to the pull-down node QB, a first electrode of the nineteenth transistor M19 is connected to the first output terminal OUTPUT1, and a second electrode of the nineteenth transistor M19 is connected to the first power terminal VSS. A gate electrode of the twentieth transistor M20 is connected to the pull-down node QB, a first electrode of the twentieth transistor M20 is connected to the second output terminal OUTPUT2, and a second electrode of the twentieth transistor M20 is connected to the first power terminal VSS.

An exemplary structure of the reset sub-circuit is specifically shown in FIG. 9. Those skilled in the art can easily understand that the implementation manner of the reset sub-circuit is not limited to this, as long as the corresponding function of the reset sub-circuit can be realized.

Figure 10:
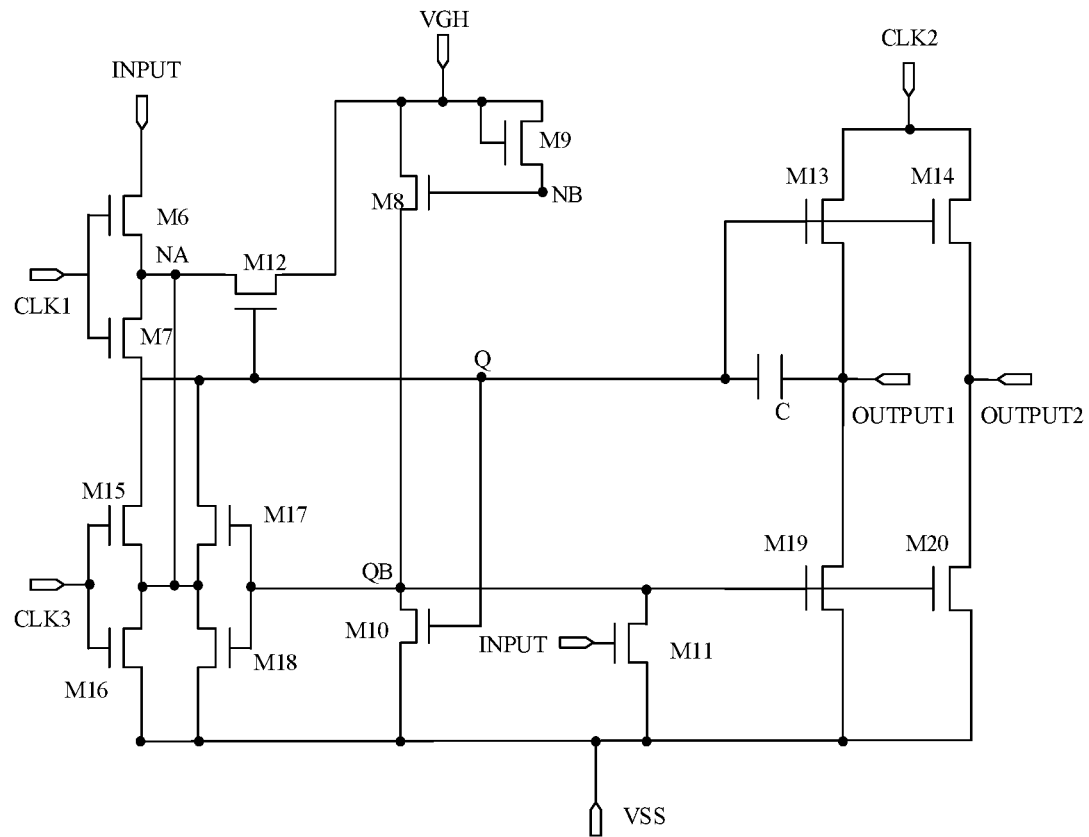
FIG. 10 is an equivalent circuit diagram of a shift register according to an embodiment of the present disclosure.

FIG. 10 is an equivalent circuit diagram of a shift register according to an embodiment of the present disclosure. As shown in FIG. 10, in a shift register according to the embodiment of the present disclosure, the input sub-circuit includes a sixth transistor M6 and a seventh transistor M7. The pull-down control sub-circuit includes an eighth transistor M8, a ninth transistor M9, a tenth transistor M10 and an eleventh transistor M11. The output sub-circuit includes a twelfth transistor M12, a thirteenth transistor M13, a fourteenth transistor M14, and a capacitor C. The reset sub-circuit includes a fifteenth transistor M15, a sixteenth transistor M16, a seventeenth transistor M17, an eighteenth transistor M18, a nineteenth transistor M19, and a twentieth transistor M20.

Specifically, a gate electrode of the sixth transistor M6 is connected to the first clock signal terminal CLK1, a first electrode of the sixth transistor M6 is connected to the first signal input terminal INPUT, and a second electrode of the sixth transistor M6 is connected to the first node NA. A gate electrode of the seventh transistor M7 is connected to the first clock signal terminal CLK1, a first electrode of the seventh transistor M7 is connected to the first node NA, and a second electrode of the seventh transistor M7 is connected to the pull-up node Q. A gate electrode of the eighth transistor M8 is connected to the second node NB, a first electrode of the eighth transistor M8 is connected to the second power terminal VGH, and a second electrode of the eighth transistor M8 is connected to the pull-down node QB. A gate and a first electrode of the ninth transistor M9 are respectively connected to the second power terminal VGH, and a second electrode of the ninth transistor M9 is connected to the second node NB. A gate electrode of the tenth transistor M10 is connected to the pull-up node Q, a first electrode of the tenth transistor M10 is connected to the pull-down node QB, and a second electrode of the tenth transistor M10 is connected to the first power terminal VSS. A gate electrode of the eleventh transistor M11 is connected to the first signal input terminal INPUT, a first electrode of the eleventh transistor M11 is connected to the pull-down node QB, and a second electrode of the eleventh transistor M11 is connected to the first power terminal VSS. A gate electrode of the twelfth transistor M12 is connected to the pull-up node Q, a first electrode of the twelfth transistor M12 is connected to the first node NA, and a second electrode of the twelfth transistor M12 is connected to the second power terminal VGH. A gate electrode of the thirteenth transistor M13 is connected to the pull-up node Q, a first electrode of the thirteenth transistor M13 is connected to the second clock signal terminal CLK2, and a second electrode of the thirteenth transistor M13 is connected to the first output terminal OUTPUT1. A gate electrode of the fourteenth transistor M14 is connected to the pull-up node Q, a first electrode of the fourteenth transistor M14 is connected to the second clock signal terminal CLK2, and a second electrode of the fourteenth transistor M14 is connected to the second output terminal OUTPUT2. One end of the capacitor C is connected to the pull-up node Q, and the other end of the capacitor C is connected to the first output terminal OUTPUT1. A gate electrode of the fifteenth transistor M15 is connected to the third clock signal terminal CLK3, a first electrode of the fifteenth transistor M15 is connected to the pull-up node Q, and a second electrode of the fifteenth transistor M15 is connected to the first node NA. A gate electrode of the sixteenth transistor M16 is connected to the third clock signal terminal CLK3, a first electrode of the sixteenth transistor M16 is connected to the first node NA, and a second electrode of the sixteenth transistor M16 is connected to the first power terminal VSS. A gate electrode of the seventeenth transistor M17 is connected to the pull-down node QB, a first electrode of the seventeenth transistor M17 is connected to the pull-up node Q, and a second electrode of the seventeenth transistor M17 is connected to the first node NA. A gate electrode of the eighth transistor M18 is connected to the pull-down node QB, a first electrode of the eighteenth transistor M18 is connected to the first node NA, and a second electrode of the eighteenth transistor M18 is connected to the first power terminal VSS. A gate electrode of the nineteenth transistor M19 is connected to the pull-down node QB, a first electrode of the nineteenth transistor M19 is connected to the first output terminal OUTPUT1, and a second electrode of the nineteenth transistor M19 is connected to the first power terminal VSS. A gate electrode of the twentieth transistor M20 is connected to the pull-down node QB, a first electrode of the twentieth transistor M20 is connected to the second output terminal OUTPUT2, and a second electrode of the twentieth transistor M20 is connected to the first power terminal VSS.

FIG. 10 shows exemplary structures of an input sub-circuit, a pull-down control sub-circuit, an output sub-circuit, and a reset sub-circuit. Those skilled in the art can easily understand that implementation manners of the above sub-circuits are not limited thereto, as long as respective functions of the above sub-circuits can be achieved.

Optionally, the pull-down control sub-circuit is further configured to reset a potential of the pull-down node under the control of the second input signal.

Specifically, the pull-down control sub-circuit is further connected to a second signal input terminal CK, and is configured to supply a signal at the first power terminal VSS to the pull-down node QB under the control of the second signal input terminal CK.

Figure 11:
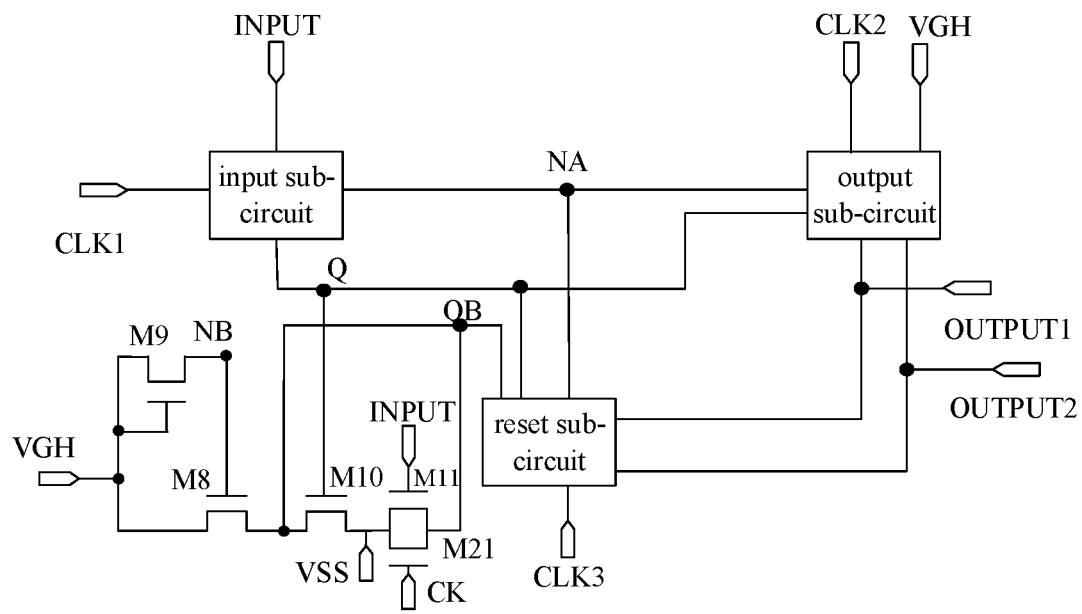
FIG. 11 is an equivalent circuit diagram of a pull-down control sub-circuit according to an embodiment of the present disclosure.

FIG. 11 is an equivalent circuit diagram of a pull-down control sub-circuit according to an embodiment of the present disclosure. As shown in FIG. 11, the pull-down control sub-circuit according to the embodiment of the present disclosure includes: an eighth transistor M8, a ninth transistor M9, a tenth transistor M10, an eleventh transistor M11 and a twenty-first transistor M21.

Specifically, a gate electrode of the eighth transistor M8 is connected to the second node NB, a first electrode of the eighth transistor M8 is connected to the second power terminal VGH, and a second electrode of the eighth transistor M8 is connected to the pull-down node QB. A gate electrode and a first electrode of the ninth transistor M9 are connected to the second power terminal VGH, and a second electrode of the ninth transistor M9 is connected to the second node NB. A gate electrode of the tenth transistor M10 is connected to the pull-up node Q, a first electrode of the transistor M10 is connected to the pull-down node QB, and a second electrode of the tenth transistor M10 is connected to the first power terminal VSS. A gate electrode of the eleventh transistor M11 is connected to the first signal input terminal INPUT, a first electrode of the eleventh transistor M11 is connected to the pull-down node QB, and a second electrode of the eleventh transistor M11 is connected to the first power terminal VSS. A gate electrode of the twenty-first transistor M21 is connected to the second signal input terminal CK, a first electrode of the twenty-first transistor M21 is connected to the pull-down node QB, and a second electrode of the twenty-first transistor M21 is connected to the first power terminal VSS.

An exemplary structure of the pull-down control sub-circuit is specifically shown in FIG. 11. Those skilled in the art can easily understand that the implementation manner of the pull-down control sub-circuit is not limited to this, as long as the pull-down control sub-circuit can realize corresponding functions.

In a conventional gate driving circuit, since a pull-down transistor is in a high voltage state for a long time, the threshold voltage Vth of the pull-down transistor is prone to positive drift. In the shift register according to the embodiments of the present disclosure, the twenty-first transistor M21 is turned on under the control of the second signal input terminal CK, and the signal at the first power terminal VSS is transmitted to the pull-down node QB to pull down the voltage of the pull-down node QB, thereby reducing a positive drift extent of the threshold voltage Vth of the pull-down transistor to a certain extent.

Figure 12:
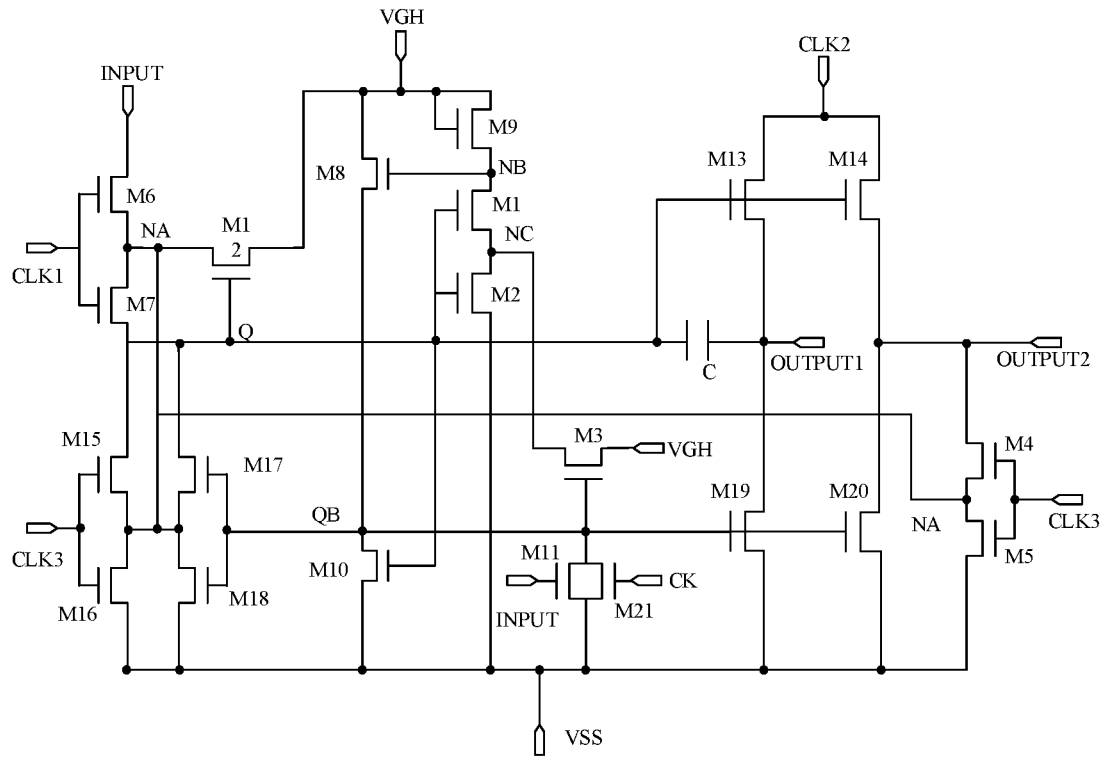
FIG. 12 is an equivalent circuit diagram of a shift register according to an embodiment of the present disclosure.

FIG. 12 is an equivalent circuit diagram of a shift register according to an embodiment of the present disclosure. As shown in FIG. 12, in a shift register according to the embodiment of the present disclosure, the output noise sub-reduction circuit includes a first transistor M1, a second transistor M2 and third transistor M3. The output control sub-circuit includes a fourth transistor M4 and a fifth transistor M5. The input sub-circuit includes a sixth transistor M6 and a seventh transistor M7. The pull-down control sub-circuit includes an eighth transistor M8, a ninth transistor M9, a tenth transistor M10, an eleventh transistor M11, and a twenty-first transistor M21. The output sub-circuit includes: a twelfth transistor M12, a thirteenth transistor M13, a fourteenth transistor M14, and a capacitor C. The reset sub-circuit includes a fifteenth transistor M15, a sixteenth transistor M16, a seventeenth transistor M17, an eighteenth transistor M18, a nineteenth transistor M19, and a twentieth transistor M20.

Specifically, a gate electrode of the first transistor M1 is connected to the pull-up node Q, a first electrode of the first transistor M1 is connected to the second node NB, and a second electrode of the first transistor M1 is connected to the third node NC. A gate electrode of the second transistor M2 is connected to the pull-up node Q, a first electrode of the second transistor M2 is connected to the third node NC, and a second electrode of the second transistor M2 is connected to the first power terminal VSS. A gate electrode of the third transistor M3 is connected to the pull-down node QB, a first electrode of the third transistor M3 is connected to the third node NC, and a second electrode of the third transistor M3 is connected to the second power terminal VGH. A gate electrode of the fourth transistor M4 is connected to the third clock signal terminal CLK3 Connected, a first electrode of the fourth transistor M4 is connected to the second output terminal OUTPUT2, and a second electrode of the fourth transistor M4 is connected to the first node NA. A gate electrode of the fifth transistor M5 is connected to the third clock signal terminal CLK3, a first electrode of the five transistor M5 is connected to the first node NA, and a second electrode of the fifth transistor M5 is connected to the first power terminal VSS. A gate electrode of the sixth transistor M6 is connected to the first clock signal terminal CLK1, and a first electrode of the sixth transistor M6 is connected to the first signal input terminal INPUT, and a second electrode of the sixth transistor M6 is connected to the first node NA. A gate electrode of the seventh transistor M7 is connected to the first clock signal terminal CLK1, a first electrode of the seventh transistor M7 is connected to the first node NA, and a second electrode of the seventh transistor M7 is connected to the pull-up node Q. A gate electrode of the eighth transistor M8 is connected to the second node NB, a first electrode of the eighth transistor M8 is connected to the second power terminal VGH, and a second electrode of the eighth transistor M8 is connected to the pull-down node QB. A gate electrode and a first electrode of the ninth transistor M9 are connected to the second power terminal VGH, and a second electrode of the ninth transistor M9 is connected to the second node NB. A gate electrode of the tenth transistor M10 is connected to the pull-up node Q, a first electrode of the tenth transistor M10 is connected to the pull-down node QB, and a second electrode of the tenth transistor M10 is connected to the first power terminal VSS. A gate electrode of the eleventh transistor M11 is connected to the first signal input terminal INPUT, a first electrode of the eleventh transistor M11 is connected to the pull-down node QB, and a second electrode of the eleventh transistor M11 is connected to the first power terminal VSS. A gate electrode of the twenty-first transistor M21 is connected to the second signal input terminal CK, a first electrode of the twenty-first transistor M21 is connected to the pull-down node QB, and a second electrode of the twenty-first transistor M21 is connected to the first power terminal VSS. A gate electrode of the twelfth transistor M12 is connected to the pull-up node Q, a first electrode of the twelfth transistor M12 is connected to the first node NA, and a second electrode of the twelfth transistor M12 is connected to the second power terminal VGH. A gate electrode of the thirteenth transistor M13 is connected to the pull-up node Q, a first electrode of the thirteenth transistor M13 is connected to the second clock signal terminal CLK2, and a second electrode of the thirteenth transistor M13 is connected to the first output terminal OUTPUT1. A gate electrode of the fourteenth transistor M14 is connected to the pull-up node Q, a first electrode of the fourteenth transistor M14 is connected to the second clock signal terminal CLK2, and a second electrode of the fourteen transistor M14 is connected to the second output terminal OUTPUT2. One end of the capacitor C is connected to the pull-up node Q, and the other end of the capacitor C is connected to the first output terminal OUTPUT1. A gate electrode of the fifteenth transistor M15 is connected to the third clock signal terminal CLK3, a first electrode of the fifteenth transistor M15 is connected to the pull-up node Q, and a second electrode of the fifteenth transistor M15 is connected to the first node NA. A gate electrode of the sixteenth transistor M16 is connected to the third clock signal terminal CLK3, a first electrode of the sixteenth transistor M16 is connected to the first node NA, and a second electrode of the sixteenth transistor M16 is connected to the first power terminal VSS. A gate electrode of the seventeenth transistor M17 is connected to the pull-down node QB, a first electrode of the seventeenth transistor M17 is connected to the pull-up node Q, and a second electrode of the seventeenth transistor M17 is connected to the first node NA. A gate electrode of the eighteenth transistor M18 is connected to the pull-down node QB, a first electrode of the eighteenth transistor M18 is connected to the first node NA, and a second electrode of the eighteenth transistor M18 is connected to the first power terminal VSS. A gate electrode of the nineteenth transistor M19 is connected to the pull-down node QB, a first electrode of the nineteenth transistor M19 is connected to the first output terminal OUTPUT1, and a second electrode of the nineteenth transistor M19 is connected to the first power terminal VSS. A gate electrode of the twentieth transistor M20 is connected to the pull-down node QB, a first electrode of the twentieth transistor M20 is connected to the second output terminal OUTPUT2, and a second electrode of the twentieth transistor M20 is connected to the first power terminal VSS.

FIG. 12 shows exemplary structures of an input sub-circuit, a pull-down control sub-circuit, an output sub-circuit, a reset sub-circuit, a noise reduction sub-circuit and an output control sub-circuit. Those skilled in the art can easily understand that the implementation manners of the above sub-circuits are not limited thereto, as long as sub-circuits can achieve their respective functions.

In the embodiments of the present disclosure, the first node NA is connected between the sixth transistor M6 and the seventh transistor M7, between the fifteenth transistor M15 and the sixteenth transistor M16, and between the seventeenth transistor M17 and the eighteenth transistor M18, respectively, which can avoid a current leakage of the pull-up node Q. Additionally, the first node NA is connected between the fourth transistor M4 and the fifth transistor M5 to prevent a current or a voltage of the second output terminal OUTPUT2 from leaking, thereby ensuring output stability.

In the embodiments of the present disclosure, the third node NC is connected between the first transistor M1 and the second transistor M2, thereby reducing a current leaked from the gate electrode of the eighth transistor M8, ensuring a gate voltage of the eighth transistor M8 to be stable, and ensuring the pull-down node QB at a relatively high voltage when the threshold voltage Vth of the eighth transistor M8 is low (for example, Vth=−4 v). Experiments show that when the threshold voltage Vth of each transistor in the conventional gate driving circuit is −4 v, the voltage VQB of the pull-down node QB is 5 v. In the embodiment of the present disclosure, when each transistor of the gate driving circuit has a threshold voltage Vth=−4 v, the voltage VQB of the pull-down node QB is 10 v, which can ensure that the pull-down transistors (the seventeenth transistor M17, the eighteenth transistor M18, the nineteenth transistor M19, and the twentieth transistor M20) are fully turned on, and ensure that signals outputted from the first output terminal and the second output terminal have low noises, thereby ensuring the stability of the gate driving circuit.

In the embodiments of the present disclosure, the twenty-first transistor M21 provides the signal of the first power terminal VSS to the pull-down node QB under the control of the second signal input terminal CK to pull down the voltage of the pull-down node QB, thereby reducing the positive floating of the threshold voltage Vth of the pull-down transistors to a certain extent.

In the embodiments of the present disclosure, a duration Tf of the falling edge of the output signal is greatly reduced by providing the fourth transistor M4 and the fifth transistor M5.

In some embodiments, all of the transistors M1 to M21 may be N-type thin film transistors or P-type thin film transistors, which can unify process flows, reduce the number of process flows and improve the yield of the product. In addition, considering that the low-temperature polysilicon thin film transistor has a low leakage current, all the transistors in the embodiments of the present disclosure may be low-temperature polysilicon thin film transistors. The thin film transistor may specifically be a bottom-gate thin film transistor or a top-gate thin film transistor, as long as the switching function can be realized. In the embodiments of the present disclosure, in order to distinguish two electrodes of a transistor except the gate electrode, one is referred to as a first electrode, and the other one is referred to as a second electrode. When a transistor is an N-type transistor, a voltage for turning on the transistor (referred to as a turn-on voltage) is a high level voltage (for example, 5V, 10V, or other suitable voltage), and a voltage for turning off the transistor (referred to as a turn-off voltage) is a low level voltage (for example, 0V, −5V, −10V, or other suitable voltage).

It should be noted that the capacitor C may be a liquid crystal capacitor formed by a pixel electrode and a common electrode, or an equivalent capacitor formed by a storage capacitor and the liquid crystal capacitor, which is not limited herein.

The technical solution in the embodiments of the present disclosure is further described below based on a working process of a shift register. It should be noted that a working process of a first stage of shift register is given as an example in the following description.

In a circuit structure shown in FIG. 12, an example is given that all the transistors M1 to M21 are N-type thin film transistors, the first power terminal VSS supplies a low-level signal and the second power terminal VDD supplies a high-level signal. Those skilled in the art can understand that embodiments of the present disclosure can also be applied to a case where all the transistors are N-type thin film transistors, as long as corresponding signals of every signal terminals are inverted.

FIG. 13 is a timing diagram of a shift register according to an embodiment of the present disclosure. As shown in FIG. 12 and FIG. 13, the shift register according to the embodiment of the present disclosure includes 21 transistor units (M1 to M21), one capacitor unit (C), five input terminals (STU, CK, CLK1, CLK2 and CLK3), two output terminals (CR(N) and OUTPUT(N)) and two power terminals (VSS and VGH). A high-level signal is continuously supplied through the first power terminal VGH, and a low-level signal is continuously supplied through the second power terminal VSS. The working processes of the shift register are as follows.

In a first stage S1, also referred to as an input stage, an signal inputted to the first signal input terminal INPUT is at a high level, a signal inputted to the first clock signal terminal CLK1 is at a high level, the sixth transistor M6 and the seventh transistor M7 are turned on, a potential of the pull-up node Q is pulled up, and the capacitor C is charged by the high level of the pull-up node Q. Since the potential of the pull-up node Q is pulled up, the tenth transistor M10, the twelfth transistor M12, the first transistor M1 and the second transistor M2 are turned on, and a potential of the second node NB is pulled down, thus, the eighth transistor M8 is turned off a this time. Since the tenth transistor M10 and the eleventh transistor M11 are turned on, a potential of the pull-down node QB is pulled down and in a low level.

In a second stage S2, also referred to as an output stage, the input signal of the first signal input terminal INPUT1 is at a low level, and the input signal of the second clock signal terminal CLK2 is at a high level. Under the bootstrapping effect of the capacitor C, a potential of the pull-up node Q is raised to the second high level, the thirteenth transistor M13 and the fourteenth transistor M14 are turned on, and the high-level signal of the second clock signal terminal CLK2 is completely outputted to the first output terminal OUTPUT1 and the second output terminal OUTPUT2 without loss of threshold voltage Vth. At this time, the twelfth transistor M12 is turned on, and the first node NA is at a high level due to the high level of the second power terminal VGH, which enables a voltage of the pull-up node Q not to lose or leak through the sixth transistor M6, the seventh transistor M7, the fifteenth transistor M15, the sixteenth transistor M16, the seventeenth transistor M17 or the eighteenth transistor M18. Thus, the maintained high level voltage of pull-up node Q enables the thirteenth transistor M13 and the fourteenth transistor M14 to be fully turned on, and the high-level signal of the second clock signal terminal CLK2 is completely outputted to the first output terminal OUTPUT1 and the second output terminal OUTPUT2 without losing the threshold voltage Vth.

In a third stage S3, also referred to as a reset stage, an input signal of the third clock signal terminal CLK3 is at a high level, the fifteenth transistor M15 and the sixteenth transistor M16 are turned on, and the potential of the pull-up node Q is pulled down to the low level of first power terminal VSS. At this time, the ninth transistor M9 is turned on, so that the second node NB is pulled up to the high level of the second power terminal VGH, and the eighth transistor M8 is turned on. The potential of the pull-down node QB is a high level, the seventeenth transistor M17 and the eighteenth transistor M18 are turned on to further lower the potential of the pull-up node Q, and the nineteenth transistor M19 and the twentieth transistor M20 are turned on, to pull down potentials of the first output terminal OUTPUT1 and the second output terminal OUTPUT2, respectively. In addition, the fourth transistor M4 and the fifth transistor M5 are turned on, and the potential of the second output terminal OUTPUT2 is quickly pulled down to the low level of the first power terminal VSS, and a duration of the falling edge of an output signal outputted from the second output terminal OUTPUT2 is shortened, so as to make the falling edge of the output signal of the second output terminal OUTPUT2 steeper.

Further, the third transistor M3 is turned on due to the high level of the pull-down node QB, and the third node NC is pulled up to the high level of the second power terminal VGH, which reduces a leakage current of the eighth transistor M8, ensures the gate voltage of the eighth transistor M8 to be stable and ensures the eighth transistor M8 to be fully turned on, thereby maintaining the potential of the pull-down node QB at a high level even if the threshold voltage Vth of the eighth transistor M8 is equal to −4 v.

Therefore, the noises of output signals at the first output terminal OUTPUT1 and the second output terminal OUTPUT2 are sufficiently reduced through the seventeenth transistor M17, the eighteenth transistor M18, the nineteenth transistor M19 and the twentieth transistor M20 that are turned on, thereby ensuring the stability of the gate driving circuit.

In a fourth stage (Blank Time), which is the stage of pulling down the pull-down node, the input signal at the second signal input terminal CK is at a high level, and the twenty-first transistor M21 is turned on, which pulls down the potential of the pull-down node QB to the low level of the first power terminal VSS.

In the embodiments of the present disclosure, the output sub-circuit maintains the voltage of the pull-up node Q under the action of the at first node NA, which ensures that the voltage of the pull-up node does not leak and ensures the signal the second clock signal terminal CLK2 to be completely outputted to the first output terminal and the second output terminal, thereby improving display quality of a display panel. Moreover, the voltage of the pull-down node is maintained at a high level under the control of the pull-up node, so that the transistors (M17 to M20) of the reset sub-circuit are fully turned on to reduce noises of output signals, thereby ensuring the stability of a gate driving circuit.

Based on the same inventive concept, some embodiments of the present disclosure further provide a method for driving a shift register, which is applied to the shift register provided in the foregoing embodiments. The shift register includes: an input sub-circuit, a pull-down control sub-circuit, an output sub-circuit, a reset sub-circuit, a first signal input terminal, a first clock signal terminal, a second clock signal terminal, a third clock signal terminal, a first power terminal, a second power terminal, a first output terminal and a second output terminal. FIG. 14 is a flowchart of a method for driving a shift register according to an embodiment of the present disclosure. As shown in FIG. 14, the method specifically includes steps 100 to 400.

Step 100 includes: inputting, by the input sub-circuit, the first input signal of the first signal input terminal to the pull-up node under the control of a first clock signal terminal, and supplying, by the pull-down control sub-circuit, the first voltage signal of the first power terminal to the pull-down node under the control of the first input signal and the potential of the pull-up node.

Specifically, an input signal of the first clock signal terminal is a pulse signal. In step 100, the input signal of the first signal input terminal is at a high level, the input sub-circuit pulls up the potential of the pull-up node, and the pull-down control sub-circuit pulls down the potential of the pull-down node.

Step 200 includes: outputting, by the output sub-circuit, the second clock signal of the second clock signal terminal to the first output terminal and the second output terminal, and controlling the voltage of the pull-up node under the control of the potential of the first node.

Specifically, in this step, the signal inputted to the second clock signal input terminal is at a high level, and signals outputted to the first output terminal and the second output terminal are both at a high level.

Step 300 includes: outputting, by the reset sub-circuit, the first voltage signal of the first power terminal to the pull-up node, the first output terminal and the second output terminal under the control of a third clock signal terminal and the potential of the pull-down node.

Specifically, the input signal of the third clock signal terminal is a pulse signal. In this step, the input signal of the third clock signal terminal is at a high level, and the reset sub-circuit may pull down levels of the pull-up node, the first output terminal and the second output terminal to a low-level signal of the first power terminal to reduce noises.

Optionally, the method for driving a shift register further includes:

Step 400 includes: supplying, by the pull-down control sub-circuit, a signal of the first power terminal to the pull-down node under the control of the first input signal of the first signal input terminal and the potential of the pull-up node.

Specifically, the input signal of the second signal input terminal is a pulse signal. In this step, the input signal of the second signal input terminal is at a high level, and the pull-down control sub-circuit pulls the potential of the pull-down node to a low level of the first power terminal VSS, which reduces the positive floating of the threshold voltage Vth of the pull-down transistor to a certain extent.

Optionally, the shift register further includes a noise reduction sub-circuit, and step 100 further includes: controlling the voltage of the pull-down node by the noise reduction sub-circuit under the control of the pull-up node.

Optionally, the shift register further includes an output control sub-circuit, and step 300 further includes: outputting the signal of the first power terminal to the second output terminal under the control of the third clock signal terminal.

Optionally, as shown in FIG. 12 and FIG. 13, the method for driving the shift register further includes:

in a first stage S1, inputting a first-level signal to the first clock signal terminal CLK1 and the first signal input terminal INPUT, so that the input sub-circuit inputs a first level of the first signal input terminal INPUT to the pull-up node Q under the control of the first clock signal terminal CLK1;

in a second stage S2, inputting a first-level signal to the second clock signal terminal CLK2, to maintain the voltage of the pull-up node Q and to output the complete first level to the first output terminal OUTPUT1 and the second output terminal OUTPUT2;

in a third stage S3, inputting a first-level signal to the third clock signal terminal CLK3 of the reset sub-circuit, to reset potentials of the pull-up node, the first output terminal and the second output terminal under the control of the first-level signal of the third clock signal terminal and a potential of the pull-down node; and in a fourth stage S4, inputting a first-level signal to the second signal input terminal CK of the pull-down control sub-circuit, to supply the first voltage signal of the first power terminal to the pull-down node under the control of the first level.

The method for driving a shift register provided by the embodiments of the present disclosure includes: inputting, by the input sub-circuit, a signal of the first signal input terminal to the pull-up node under the control of the first clock signal terminal, and supplying, by the pull-down control sub-circuit, a signal of the first power terminal to the pull-down node under the control of the signal of the first signal input terminal and a potential of the pull-up node; outputting, by the output sub-circuit, a signal at the second clock signal terminal to the first output terminal and the second output terminal, and maintaining the voltage of the pull-up node under the control of the potential of the first node; outputting, by the reset sub-circuit, a signal from the first power terminal to the pull-up node, the first output terminal and the second output terminal under the control of the third clock signal terminal and the potential of the pull-down node; and supplying, by the pull-down control sub-circuit, a signal of the first power terminal to the pull-down node under the control of the first input signal of the first signal input terminal and the potential of the pull-up node. In the technical solutions according to the embodiment of the present disclosure, the output sub-circuit maintains the voltage of the pull-up node in response to the first node, which ensures that the voltage of the pull-up node does not leak and ensures the signal at the second clock signal terminal to be completely outputted to the first output terminal and the second output terminal, thereby improving display quality of a display panel.

Figure 15:
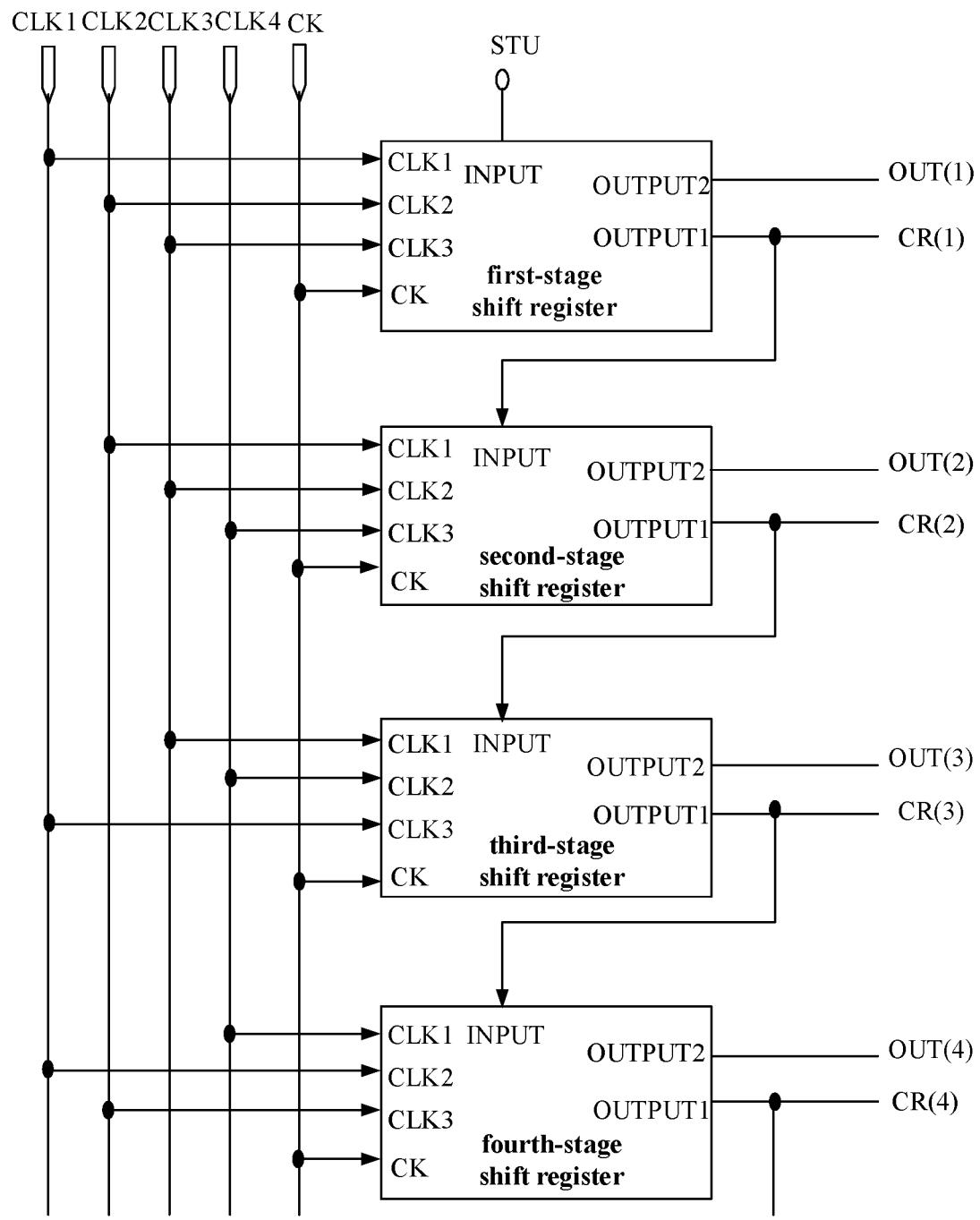
FIG. 15 is a schematic structural diagram of a gate driving circuit according to an embodiment of the present disclosure.

Based on the same inventive concept, embodiments of the present disclosure further provide a gate driving circuit. FIG. 15 is a schematic diagram of a gate driving circuit according to an embodiment of the present disclosure. As shown in FIG. 15, the gate driving circuit includes a plurality of cascaded shift registers, which includes a first-stage shift register GOA(1), a second-stage shift register GOA(2), a third-stage shift register GOA(3), a fourth-stage shift register GOA(4), and so on, where:

a first signal input terminal of a first stage of the shift registers is connected to an initial signal input terminal, and a first signal input terminal of an (N+2)-th stage of the shift registers is connected to a first signal output terminal of an (N+1)-th stage of the shift registers, N being an integer greater than or equal to 0;

a second signal input terminal of each stage of the shift registers is connected to an external second input terminal;

an (4N+1)-th stage of the shift registers has a first clock signal terminal connected to an external first clock signal line, a second clock signal terminal connected to an external second clock signal line, and a third clock signal terminal connected to an external third clock signal line;

an (4N+2)-th stage of the shift registers has a first clock signal terminal connected to the external second clock signal line, a second clock signal terminal connected to the external third clock signal line, and a third clock signal terminal connected to an external fourth clock signal line;

an (4N+3)-th stage of the shift registers has a first clock signal terminal connected to the external third clock signal line, a second clock signal terminal connected to the external fourth clock signal line, and a third clock signal terminal connected to the external first clock signal line; and an (4N+4)-th stage of the shift registers has a first clock signal terminal connected to the external fourth clock signal line, a second clock signal terminal connected to the external first clock signal line, and a third clock signal terminal connected to the external second clock signal line.

Specifically, for the first-stage shift register GOA(1), the first signal input terminal INPUT is connected to the initial signal input terminal STU, the first clock signal terminal CLK1 is connected to the external first clock signal line, and the second clock signal terminal CLK2 is connected to the external second clock signal line, the third clock signal terminal CLK3 is connected to the external third clock signal line, the second signal input terminal CK is connected to the external second signal input terminal, and the first output terminal CR(1) is connected to the first signal input terminal INPUT of the second-stage shift register GOA(2); for the second-stage shift register GOA(2), the first clock signal terminal CLK1 is connected to the external second clock signal line, the second clock signal terminal CLK2 is connected to the external third clock signal line, the third clock signal terminal CLK3 is connected to the external fourth clock signal line, the second signal input terminal CK is connected to the external second signal input terminal, and the first output terminal CR(2) is connected to the first signal input terminal INPUT of the third-stage shift register GOA (3); and so on.

The shift register is the shift register provided in the above embodiments, and implementation principles and implementation effects in this embodiment are similar to these in the above embodiments, and details are not described herein again.

Experiments show that when a threshold voltage Vth of each transistor in the gate driving circuit of the embodiments of the present disclosure is Vth=−4 v, a voltage outputted by the first stage to the eighth stage of shift registers is 19.86 v (VSS=20 v), and the output has no obvious glitch; when Vth=9 v, the voltage outputted by the first stage to the eighth stage of shift registers is 20 v (VSS=20 v), and the output is stable.

Figure 16:
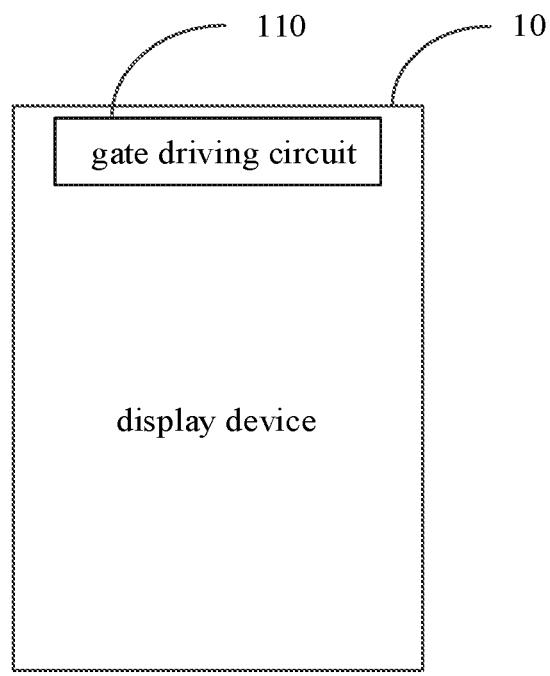
FIG. 16 is a schematic block diagram of a display device according to an embodiment of the present disclosure.

FIG. 16 is a schematic block diagram of a display device according to an embodiment of the present disclosure. As shown in FIG. 16, the display device 10 may include the gate driving circuit 110 according to the above embodiments of the present disclosure. The display device according to an embodiment of the present disclosure may be any product or component having a display function, such as an electronic paper, a mobile phone, a tablet computer, a television, a display, a notebook computer, a digital photo frame, a navigator, and the like.

In the technical solutions according to the embodiments of the present disclosure, the output sub-circuit maintains the amplitude of the voltage of the pull-up node in response to the first node, which ensures that the voltage of the pull-up node does not leak and ensures the signal at the second clock signal terminal to be completely outputted to the first output terminal and the second output terminal, thereby improving display quality of the display device.

It should be noted that drawings of the embodiments of the present disclosure only relate to structures involved in the embodiments of the present disclosure, and other structures can refer to the general design.

In case of no conflict, the embodiments of the present disclosure including features in the embodiments can be combined with each other to obtain new embodiments.

Although the embodiments in the present disclosure are described above, the described content is only for facilitating understanding of the present disclosure, and is not intended to limit the present disclosure. A person skilled in the art can make numerous modifications and changes in the form and details of implementation without departing from the spirit and scope disclosed in present disclosure. The protection scope of the present disclosure shall be subject to the scope defined by the appended claims.

What is claimed is:

1. A shift register, comprising: an input sub-circuit, a pull-down control sub-circuit, an output sub-circuit, a reset sub-circuit and a noise reduction sub-circuit, wherein:
   the input sub-circuit is connected to a pull-up node and a first node, and is configured to input a first input signal of a first signal input terminal to the pull-up node under the control of a first clock signal;
   the pull-down control sub-circuit is connected to the first signal input terminal, the pull-up node, a pull-down node and a first power terminal, and is configured to supply a first voltage signal of the first power terminal to the pull-down node under the control of the first input signal and a potential of the pull-up node;
   the output sub-circuit is connected to the first node and a second clock signal terminal, and is configured to output a second clock signal of the second clock signal terminal to a first output terminal and a second output terminal under the control of the potential of the pull-up node, and control a voltage of the pull-up node under the control of a potential of the first node;
   the reset sub-circuit is configured to reset potentials of the pull-up node, the first output terminal and the second output terminal under the control of a third clock signal and a potential of the pull-down node;
   the noise reduction sub-circuit is connected to the pull-up node, the pull-down node, the first power terminal and a second power terminal, and is configured to maintain a voltage of the pull-down node under the control of the potential of the pull-up node.

2. The shift register according to claim 1, wherein the noise reduction sub-circuit comprises a first transistor, a second transistor and a third transistor;
   a gate electrode of the first transistor is connected to the pull-up node, a first electrode of the first transistor is connected to a second node, and a second electrode of the first transistor is connected to a third node;
   a gate electrode of the second transistor is connected to the pull-up node, a first electrode of the second transistor is connected to the third node, and a second electrode of the second transistor is connected to the first power terminal; and
   a gate electrode of the third transistor is connected to the pull-down node, a first electrode of the third transistor is connected to the third node, and a second electrode of the third transistor is connected to the second power terminal.

3. The shift register according to claim 1, further comprising an output control sub-circuit, wherein the output control sub-circuit is configured to output the first voltage signal of the first power terminal to the second output terminal under the control of the third clock signal.

4. The shift register according to claim 3, wherein the output control sub-circuit comprises a fourth transistor and a fifth transistor;
   a gate electrode of the fourth transistor is connected to a third clock signal terminal, a first electrode of the fourth transistor is connected to the second output terminal, and a second electrode of the fourth transistor is connected to the first node; and
   a gate electrode of the fifth transistor is connected to the third clock signal terminal, a first electrode of the fifth transistor is connected to the first node, and a second electrode of the fifth transistor is connected to the first power terminal.

5. The shift register according to claim 1, wherein the input sub-circuit comprises a sixth transistor and a seventh transistor;
   a gate electrode of the sixth transistor is connected to a first clock signal terminal, a first electrode of the sixth transistor is connected to the first signal input terminal, and a second electrode of the sixth transistor is connected to the first node; and
   a gate electrode of the seventh transistor is connected to the first clock signal terminal, a first electrode of the seventh transistor is connected to the first node, and a second electrode of the seventh transistor is connected to the pull-up node.

6. The shift register according to claim 1, wherein the pull-down control sub-circuit comprises an eighth transistor, a ninth transistor, a tenth transistor and an eleventh transistor;
   a gate electrode of the eighth transistor is connected to a second node, a first electrode of the eighth transistor is connected to a second power terminal, and a second electrode of the eighth transistor is connected to the pull-down node;

a gate and a first electrode of the ninth transistor are connected to the second power terminal, and a second electrode of the ninth transistor is connected to the second node;

a gate electrode of the tenth transistor is connected to the pull-up node, a first electrode of the tenth transistor is connected to the pull-down node, and a second electrode of the tenth transistor is connected to the first power terminal; and a gate electrode of the eleventh transistor is connected to the first signal input terminal, a first electrode of the eleventh transistor is connected to the pull-down node, and a second electrode of the eleventh transistor is connected to the first power terminal.

7. The shift register according to claim 1, wherein the output sub-circuit comprises a twelfth transistor, a thirteenth transistor, a fourteenth transistor and a capacitor;

a gate electrode of the twelfth transistor is connected to the pull-up node, a first electrode of the twelfth transistor is connected to the first node, and a second electrode of the twelfth transistor is connected to a second power terminal;

a gate electrode of the thirteenth transistor is connected to the pull-up node, a first electrode of the thirteenth transistor is connected to the second clock signal terminal, and a second electrode of the thirteenth transistor is connected to the first output terminal;

a gate electrode of the fourteenth transistor is connected to the pull-up node, a first electrode of the fourteenth transistor is connected to the second clock signal terminal, and a second electrode of the fourteenth transistor is connected to the second output terminal; and one end of the capacitor is connected to the pull-up node, and the other end of the capacitor is connected to the first output terminal.

8. The shift register according to claim 1, wherein the reset sub-circuit comprises a fifteenth transistor, a sixteenth transistor, a seventeenth transistor, an eighteenth transistor, a nineteenth transistor and a twentieth transistor;

a gate electrode of the fifteenth transistor is connected to a third clock signal terminal, a first electrode of the fifteenth transistor is connected to the pull-up node, and a second electrode of the fifteenth transistor is connected to the first node;

a gate electrode of the sixteenth transistor is connected to the third clock signal terminal, a first electrode of the sixteenth transistor is connected to the first node, and a second electrode of the sixteenth transistor is connected to the first power terminal;

a gate electrode of the seventeenth transistor is connected to the pull-down node, a first electrode of the seventeenth transistor is connected to the pull-up node, and a second electrode of the seventeenth transistor is connected to the first node;

a gate electrode of the eighteenth transistor is connected to the pull-down node, a first electrode of the eighteenth transistor is connected to the first node, and a second electrode of the eighteenth transistor is connected to the first power terminal;

a gate electrode of the nineteenth transistor is connected to the pull-down node, a first electrode of the nineteenth transistor is connected to the first output terminal, and a second electrode of the nineteenth transistor is connected to the first power terminal; and a gate electrode of the twentieth transistor is connected to the pull-down node, a first electrode of the twentieth transistor is connected to the second output terminal, and a second electrode of the twentieth transistor is connected to the first power terminal.

9. The shift register according to claim 1, wherein the pull-down control sub-circuit is further configured to reset the potential of the pull-down node under the control of a second input signal.

10. The shift register according to claim 9, wherein the pull-down control sub-circuit comprises an eighth transistor, a ninth transistor, a tenth transistor, an eleventh transistor and a twenty-first transistor;

a gate electrode of the eighth transistor is connected to a second node, a first electrode of the eighth transistor is connected to a second power terminal, and a second electrode of the eighth transistor is connected to the pull-down node;

a gate electrode and a first electrode of the ninth transistor are connected to the second power terminal, and a second electrode of the ninth transistor is connected to the second node;

a gate electrode of the tenth transistor is connected to the pull-up node, a first electrode of the tenth transistor is connected to the pull-down node, and a second electrode of the tenth transistor is connected to the first power terminal;

a gate electrode of the eleventh transistor is connected to the first signal input terminal, a first electrode of the eleventh transistor is connected to the pull-down node, and a second electrode of the eleventh transistor is connected to the first power terminal; and a gate electrode of the twenty-first transistor is connected to a second signal input terminal, a first electrode of the twenty-first transistor is connected to the pull-down node, and a second electrode of the twenty-first transistor is connected to the first power terminal.

11. The shift register according to claim 2, wherein all transistors in the shift register are N-type thin film transistors; or all transistors in the shift register are P-type thin film transistors.

12. A gate driving circuit, comprising a plurality of cascaded shift registers, wherein:

each shift register comprises an input sub-circuit, a pull-down control sub-circuit, an output sub-circuit and a reset sub-circuit, the input sub-circuit is connected to a pull-up node and a first node, and is configured to input a first input signal of a first signal input terminal to the pull-up node under the control of a first clock signal;

the pull-down control sub-circuit is connected to the first signal input terminal, the pull-up node, a pull-down node and a first power terminal, and is configured to supply a first voltage signal of the first power terminal to the pull-down node under the control of the first input signal and a potential of the pull-up node;

the output sub-circuit is connected to the first node and a second clock signal terminal, and is configured to output a second clock signal of the second clock signal terminal to a first output terminal and a second output terminal under the control of the potential of the pull-up node, and control a voltage of the pull-up node under the control of a potential of the first node;

the reset sub-circuit is configured to reset potentials of the pull-up node, the first output terminal and the second output terminal under the control of a third clock signal and a potential of the pull-down node;

a first signal input terminal of a first stage of the shift registers is connected to an initial signal input terminal, and a first signal input terminal of an (N+2)-th stage of the shift registers is connected to a first signal output terminal of an (N+1)-th stage of the shift registers, N being an integer greater than or equal to 0;

a second signal input terminal of each stage of the shift registers is connected to an external second input terminal;

an (4N+1)-th stage of the shift registers has a first clock signal terminal connected to an external first clock signal line, a second clock signal terminal connected to an external second clock signal line, and a third clock signal terminal connected to an external third clock signal line;

an (4N+2)-th stage of the shift registers has a first clock signal terminal connected to the external second clock signal line, a second clock signal terminal connected to the external third clock signal line, and a third clock signal terminal connected to an external fourth clock signal line;

an (4N+3)-th stage of the shift registers has a first clock signal terminal connected to the external third clock signal line, a second clock signal terminal connected to the external fourth clock signal line, and a third clock signal terminal connected to the external first clock signal line; and an (4N+4)-th stage of the shift registers has a first clock signal terminal connected to the external fourth clock signal line, a second clock signal terminal connected to the external first clock signal line, and a third clock signal terminal connected to the external second clock signal line.

13. The gate driving circuit according to claim 12, wherein each of the shift registers further comprises a noise reduction sub-circuit, and the noise reduction sub-circuit comprises a first transistor, a second transistor and a third transistor;

a gate electrode of the first transistor is connected to the pull-up node, a first electrode of the first transistor is connected to a second node, and a second electrode of the first transistor is connected to a third node;

a gate electrode of the second transistor is connected to the pull-up node, a first electrode of the second transistor is connected to the third node, and a second electrode of the second transistor is connected to the first power terminal; and a gate electrode of the third transistor is connected to the pull-down node, a first electrode of the third transistor is connected to the third node, and a second electrode of the third transistor is connected to the second power terminal.

14. The gate driving circuit according to claim 12, wherein each of the shift registers further comprises an output control sub-circuit, and the output control sub-circuit comprises a fourth transistor and a fifth transistor;

a gate electrode of the fourth transistor is connected to a third clock signal terminal, a first electrode of the fourth transistor is connected to the second output terminal, and a second electrode of the fourth transistor is connected to the first node; and a gate electrode of the fifth transistor is connected to the third clock signal terminal, a first electrode of the fifth transistor is connected to the first node, and a second electrode of the fifth transistor is connected to the first power terminal.

15. The gate driving circuit according to claim 12, wherein the input sub-circuit comprises a sixth transistor and a seventh transistor;

a gate electrode of the sixth transistor is connected to a first clock signal terminal, a first electrode of the sixth transistor is connected to the first signal input terminal, and a second electrode of the sixth transistor is connected to the first node; and a gate electrode of the seventh transistor is connected to the first clock signal terminal, a first electrode of the seventh transistor is connected to the first node, and a second electrode of the seventh transistor is connected to the pull-up node.

16. The gate driving circuit according to claim 12, wherein the pull-down control sub-circuit comprises an eighth transistor, a ninth transistor, a tenth transistor and an eleventh transistor;

a gate electrode of the eighth transistor is connected to a second node, a first electrode of the eighth transistor is connected to a second power terminal, and a second electrode of the eighth transistor is connected to the pull-down node;

a gate and a first electrode of the ninth transistor are connected to the second power terminal, and a second electrode of the ninth transistor is connected to a second node;

a gate electrode of the tenth transistor is connected to the pull-up node, a first electrode of the tenth transistor is connected to the pull-down node, and a second electrode of the tenth transistor is connected to the first power terminal; and a gate electrode of the eleventh transistor is connected to the first signal input terminal, a first electrode of the eleventh transistor is connected to the pull-down node, and a second electrode of the eleventh transistor is connected to the first power terminal.

17. A method for driving a shift register, wherein:

the shift register comprises: an input sub-circuit, a pull-down control sub-circuit, an output sub-circuit and a reset sub-circuit;

the input sub-circuit is connected to a pull-up node and a first node, and is configured to input a first input signal of a first signal input terminal to the pull-up node under the control of a first clock signal;

the pull-down control sub-circuit is connected to the first signal input terminal, the pull-up node, a pull-down node and a first power terminal, and is configured to supply a first voltage signal of the first power terminal to the pull-down node under the control of the first input signal and a potential of the pull-up node;

the output sub-circuit is connected to the first node and a second clock signal terminal, and is configured to output a second clock signal of the second clock signal terminal to a first output terminal and a second output terminal under the control of the potential of the pull-up node, and control a voltage of the pull-up node under the control of a potential of the first node;

the reset sub-circuit is configured to reset potentials of the pull-up node, the first output terminal and the second output terminal under the control of a third clock signal and a potential of the pull-down node;

the method comprises:

inputting, by the input sub-circuit, the first input signal to the pull-up node under the control of a first clock signal terminal, and supplying, by the pull-down control sub-circuit, the first voltage signal of the first power terminal to the pull-down node under the control of the first input signal and the potential of the pull-up node;

outputting, by the output sub-circuit, the second clock signal of the second clock signal terminal to the first output terminal and the second output terminal, and controlling the voltage of the pull-up node under the control of the potential of the first node; and outputting, by the reset sub-circuit, the first voltage signal of the first power terminal to the pull-up node, the first output terminal and the second output terminal under the control of a third clock signal terminal and the potential of the pull-down node.

18. The method according to claim 17, further comprising:

in a first stage, inputting a first-level signal to the first clock signal terminal and the first signal input terminal, so that the input sub-circuit inputs a first level of the first signal input terminal to the pull-up node under the control of the first clock signal terminal;

in a second stage, inputting a first-level signal to the second clock signal terminal, to maintain the voltage of the pull-up node and to output the complete first level to the first output terminal and the second output terminal;

in a third stage, inputting a first-level signal to the third clock signal terminal of the reset sub-circuit, to reset the potentials of the pull-up node, the first output terminal and the second output terminal under the control of the first-level signal of the third clock signal terminal and a potential of the pull-down node; and in a fourth stage, inputting a first-level signal to the second signal input terminal of the pull-down control sub-circuit, to supply the first voltage signal of the first power terminal to the pull-down node under the control of the first level.

19. A display device, comprising the gate driving circuit according to claim 12.

* * * * *